United States Patent
Izuhara et al.

(10) Patent No.: US 7,990,726 B2
(45) Date of Patent: Aug. 2, 2011

(54) TRAY-TYPE STRUCTURE DEVICE

(75) Inventors: Noboru Izuhara, Kawasaki (JP); Kazuo Fujita, Kawasaki (JP); Kouichi Kuramitsu, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 26 days.

(21) Appl. No.: 12/654,579

(22) Filed: Dec. 23, 2009

(65) Prior Publication Data
US 2010/0118489 A1    May 13, 2010

Related U.S. Application Data

(63) Continuation of application No. PCT/JP2007/063239, filed on Jul. 2, 2007.

(51) Int. Cl.
*H05K 5/00*    (2006.01)

(52) U.S. Cl. .............. 361/732; 361/679.46; 361/690; 361/692; 361/695; 454/184; 312/223.2; 165/80.4; 174/542; 174/559

(58) Field of Classification Search ............ 361/679.46, 361/679.51, 679.57, 679.58, 690, 692, 694, 361/695, 697, 715, 730, 732
See application file for complete search history.

(56) References Cited

U.S. PATENT DOCUMENTS

| | | | | |
|---|---|---|---|---|
| 5,396,401 A * | 3/1995 | Nemoz | .................... | 361/690 |
| 5,424,916 A * | 6/1995 | Martin | .................... | 361/698 |
| 5,559,678 A | 9/1996 | Fukuda et al. | | |
| 5,940,266 A * | 8/1999 | Hamilton et al. | .............. | 361/695 |
| 6,833,995 B1 * | 12/2004 | Hsue et al. | .................... | 361/727 |
| 6,934,150 B2 * | 8/2005 | Kitchen et al. | ............ | 361/679.33 |
| 7,307,851 B2 * | 12/2007 | Dimarco | .................... | 361/753 |
| 7,554,803 B2 * | 6/2009 | Artman et al. | ................. | 361/695 |
| 7,859,837 B2 * | 12/2010 | Nemoz et al. | .................. | 361/690 |
| 7,869,209 B2 * | 1/2011 | Nemoz et al. | .................. | 361/690 |
| 2004/0252456 A1 | 12/2004 | Larson et al. | | |
| 2005/0270250 A1 * | 12/2005 | Edward et al. | ................ | 343/878 |
| 2006/0133033 A1 * | 6/2006 | Straub et al. | ................... | 361/690 |

FOREIGN PATENT DOCUMENTS

| | | |
|---|---|---|
| GB | 2 402 816 | 12/2004 |
| JP | 61-267898 | 11/1986 |
| JP | 62-117399 | 5/1987 |

(Continued)

OTHER PUBLICATIONS

Patent Abstract of Japan, Publication No. 08-255989, Published Oct. 1, 1996.
Patent Abstract of Japan, Publication No. 05-299861, Published Nov. 12, 1993.
Patent Abstract of Japan, Publication No. 07-231186, Published Aug. 29, 1995.
Patent Abstract of Japan, Publication No. 2005-005704, Published Jan. 6, 2005.

(Continued)

*Primary Examiner* — Boris L Chervinsky
*Assistant Examiner* — Courtney Smith
(74) *Attorney, Agent, or Firm* — Staas & Halsey LLP

(57) ABSTRACT

A tray-type structure device includes a side plate, a front plate attached to a forward end of the side plate, having the functions of opening and closing, and positioned on the front side of a housing, a top plate attached to an upper end of the side plate, with a plurality of openings formed therein, and having the function of variably setting a ventilation resistance, a bottom plate attached to a lower end of the side plate, with a plurality of openings formed therein, and having the function of variably setting a ventilation resistance, and a back plate attached to a rearward end of the side plate, having the functions of opening and closing, and positioned on a side of the housing toward a backboard. The device has a tray structure having a tray-like shape formed by the front plate, top plate, bottom plate, side plate and back plate.

12 Claims, 21 Drawing Sheets

FOREIGN PATENT DOCUMENTS

| | | |
|---|---|---|
| JP | 05-299861 | 11/1993 |
| JP | 07-231186 | 8/1995 |
| JP | 8-255989 | 10/1996 |
| JP | 2005-005704 | 1/2005 |

OTHER PUBLICATIONS

International Search Report of International Application No. PCT/JP2007/063239 (mailed Aug. 28, 2007).

* cited by examiner

AS VIEWED IN DIRECTION INDICATED BY ARROW C

AS VIEWED IN DIRECTION INDICATED BY ARROW A

AS VIEWED IN DIRECTION INDICATED BY ARROW B

AS VIEWED IN DIRECTION INDICATED BY ARROW D

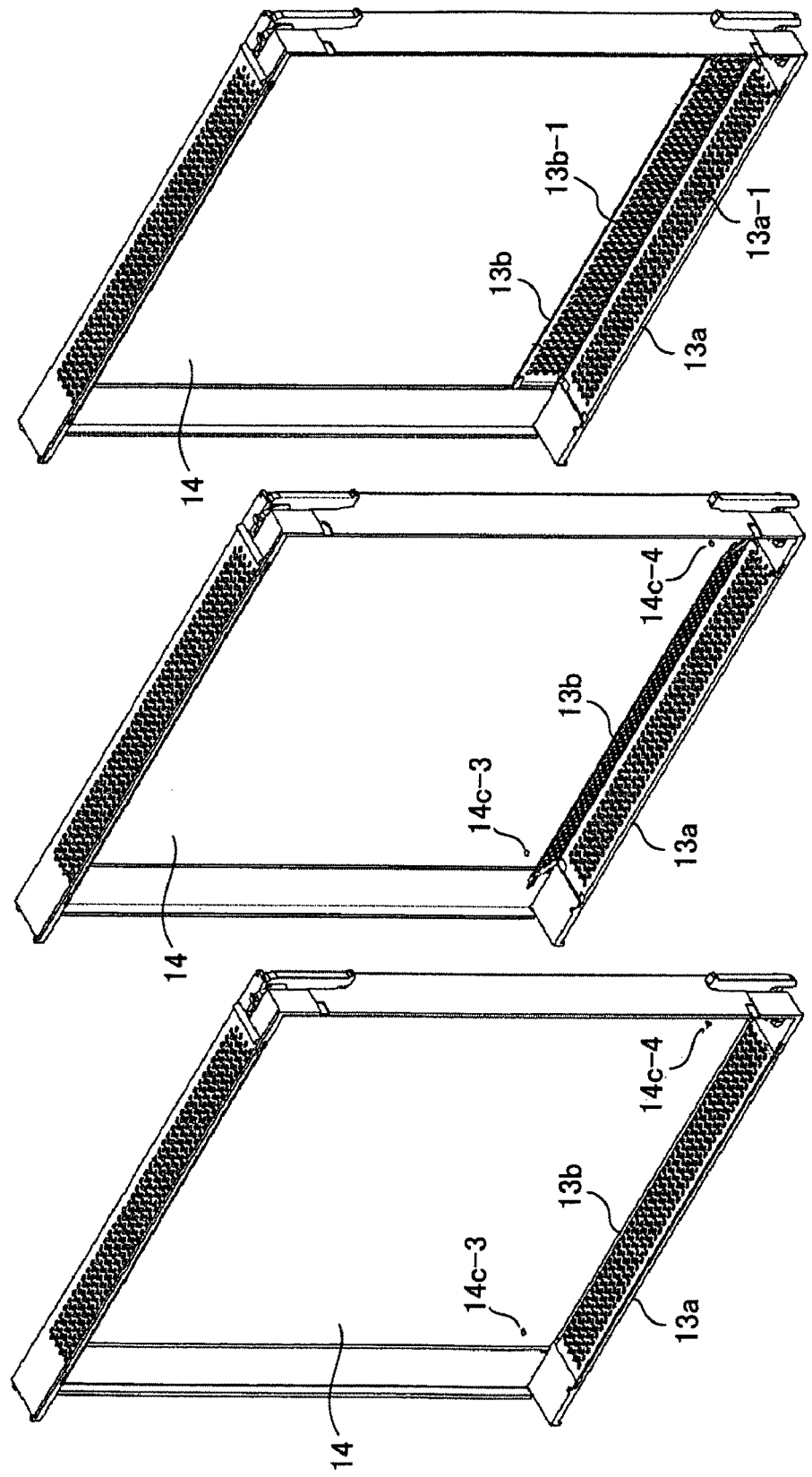

TRAY-TYPE STRUCTURE DEVICE

This application is a continuing application, filed under 35 U.S.C. §111(a), of International Application PCT/JP2007/063239, filed Jul. 2, 2007.

FIELD

The embodiment discussed herein is related to a tray-type structure device.

BACKGROUND

In an electronic apparatus, such as communication equipment, the amount of generated heat increases as an electronic circuit element becomes faster. Further, the amount of generated heat also increases in a whole housing in which printed circuit boards having high-temperature heat-generating elements mounted thereon are mounted. This requires the electronic apparatus to carry out measures against heat generation, and normally, the electronic apparatus cools the high-temperature heat-generating elements on the printed circuit boards accommodated in the housing, using forced air draft from fans.

FIGS. 18 and 19 illustrate the whole housing. In the housing 100, there are mounted a plurality of subracks 101 each for accommodating a plug-in unit (printed circuit board having electronic circuit elements mounted thereon)

Further, a plurality of fan units 102 are arranged above the subracks 101, for cooling the plug-in units 2 by forced air draft generated by the fan units 102 (the fan units 102 illustrated in FIGS. 18 and 19 are of a type which suctions air upward from below).

Here, in many cases, the plug-in units 2 accommodated in the subracks 101 are not accommodated in all the slots of the subracks 101, and further the accommodated plug-in units 2 are not uniformly arranged, due to the system configuration or the like. In such cases, forced air draft generated by the fan units 102 flows into empty slots having a small ventilation resistance (slots having no plug-in units 2 accommodated therein), which makes it impossible to send sufficient air into the plug-in units 2 accommodated in the subracks 101.

Therefore, to prevent ventilation from being imbalanced, in general, case-like structures called fillers, which serve as dummies of the plug-in units 2, are accommodated in empty slots having no plug-in units 2 mounted therein.

FIGS. 20A and 20B are schematic diagrams of the conventional filler. FIG. 21 is a diagram of openings of the filler. The filler 40 is a structure with a space formed therein, and card levers 40a and 40b for being fitted to the subrack 101 are attached on the front side thereof. Further, open holes 44 as illustrated in FIG. 21 are formed in an upper surface plate 42 and a lower surface plate 43 of the filler 40.

By causing the filler 40 configured as above to be accommodated in an empty one of the slots of the subracks 101, a suitable ventilation resistance is generated (air is also caused to flow into the filler 40 via the open holes 44), and the flow of air through ventilation passages is improved, whereby it is possible to send air not only to plug-in units 2 already accommodated in the subracks 101 but also to other subracks 101 mounted in multiple stages in the housing, and cool them.

As the related art, there has been proposed a technique for enhancing the cooling efficiency and prevention of electromagnetic interferences of a housing by attaching, when a package is not inserted in an opening of a rack, a dummy surface plate to the opening to close the opening with the dummy surface plate, and freeing, when a package is to be inserted, the opening to enable insertion of the package, (see Japanese Laid-Open Patent Publication No. 08-255989 (Paragraph numbers [0019] to [0023], and FIG. 1).

Recently, electronic circuit elements become even higher in the speed of signal processing and come to generate even higher temperature heat. In addition, the packaging density of electronic circuit elements on plug-in units has increased. This requires a higher cooling performance than before.

In the conventional filler 40, the shape and the number of the open holes 44 are fixed, whereby it has been impossible to flexibly change the ventilation resistance generated by the filler 40. Therefore, when the relationship between the ventilation resistance of the filler 40 and that of the plug-in unit 2 mounted in the subrack 101 (which is proportional to the packaging density of electronic circuit elements) is, for example, such that the ventilation resistance of the plug-in unit 2 is larger than that of the filler 40, air is guided to the filler 40, whereby it is impossible to effectively send air into the plug-in unit 2 (even when the fillers 40 are accommodated in the empty slots of the subrack 101, if the packaging density of electronic circuit elements on a plug-in unit 2 is high and the ventilation resistance of each filler 40 becomes smaller than that of the plug-in unit 2, a ventilation passage is formed on the side of the filler 40, whereby it becomes impossible to send sufficient air into the plug-in unit 2).

Further, if expansion of specifications is performed when the system is in operation and a plug-in unit 2 is to be mounted in an empty slot having the filler 40 mounted therein, the filler 40 is pulled out and the plug-in unit 2 is mounted in place. The filler 40 pulled out becomes useless and is discarded. This means that the cost of the filler 40 that is not used in the future is produced, resulting in increased costs of the whole electronic apparatus and degraded customer convenience.

SUMMARY

According to an aspect of the embodiment, a tray-type structure device that is inserted into a slot of a housing in which a plug-in unit is accommodated, includes a side plate, a front plate at a forward end of the side plate, the front plate being positioned on a front side of the housing, and having opening and closing functions, a top plate at an upper end of the side plate, the top plate having a plurality of openings formed therethrough, and having a function of variably setting a ventilation resistance, a bottom plate at a lower end of the side plate, the bottom plate having a plurality of openings formed therethrough, and having a function of variably setting a ventilation resistance, and a back plate at a rearward end of the side plate, the back plate being positioned on a backboard side of the housing, and having opening and closing functions, and has a tray structure having a tray-like shape formed by the front plate, the top plate, the bottom plate, the side plate and the back plate.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF DRAWING(S)

FIGS. 6A, 6B and 6C are diagrams of opening and closing operations of a bottom plate;

DESCRIPTION OF EMBODIMENT(S)

Figure 1:
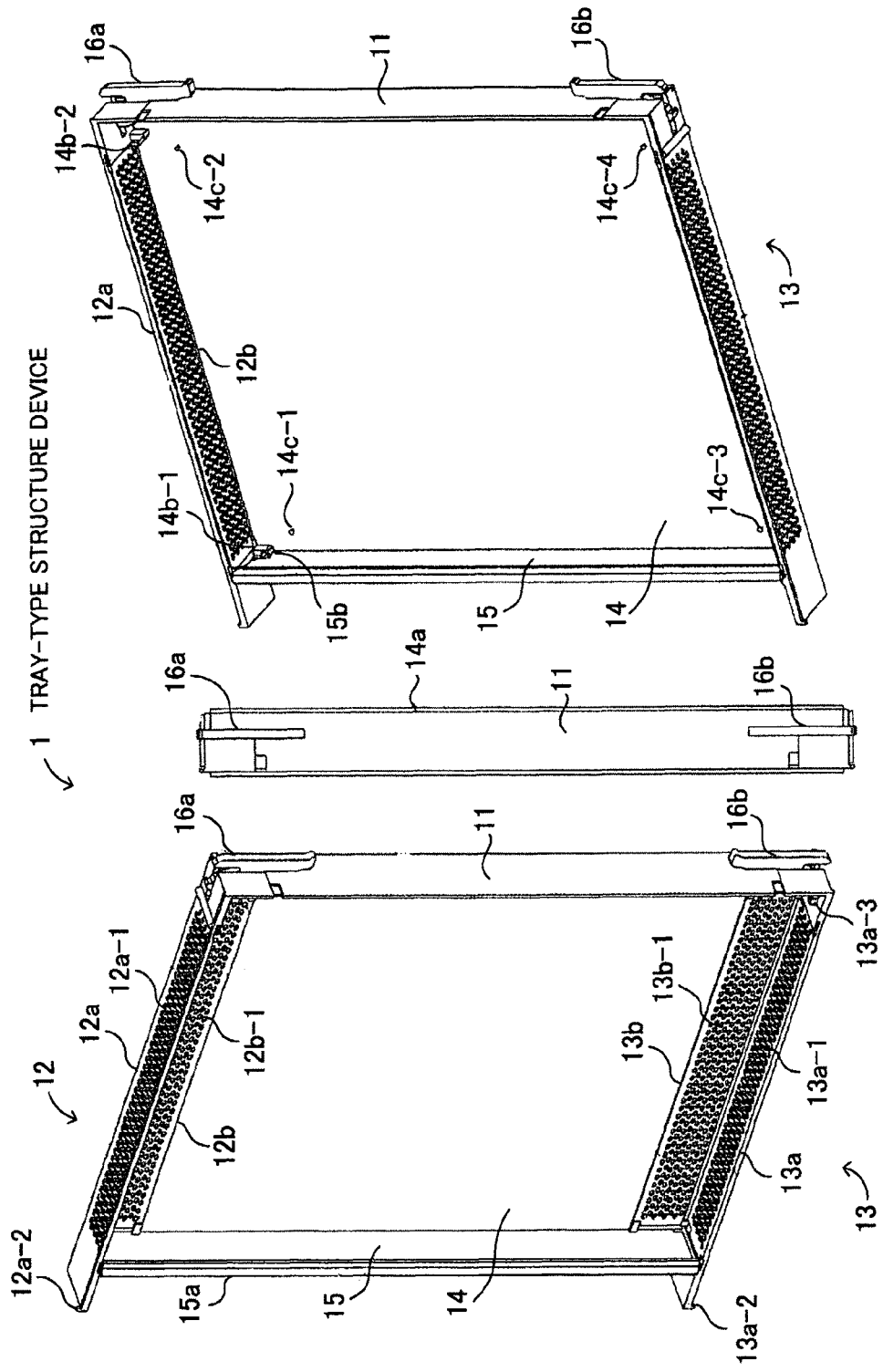
FIG. 1 is a diagram of a tray-type structure device.

An embodiment of the present invention will be described below with reference to the accompanying drawings, wherein like reference numerals refer to like elements throughout. FIG. 1 is a diagram of a tray-type structure device. The tray-type structure device 1 has a tray structure that mainly comprises a front plate 11, a top plate 12, a bottom plate 13, a side plate 14, and a back plate 15, and has a tray-like shape (box-like shape) formed by the front plate 11, the top plate 12, the bottom plate 13, the side plate 14 and the back plate 15.

The front plate 11, which is attached to a forward end of the side plate 14, and has the functions of opening and closing about a peripheral portion of the forward end of the side plate 14, is positioned on the front side of a housing. The top plate 12 is attached to an upper end of the side plate 14, with a plurality of openings formed therein, and has the function of variably setting a ventilation resistance.

The bottom plate 13 is attached to a lower end of the side plate 14, with a plurality of openings formed therein, and has the function of variably setting a ventilation resistance. The back plate 15, which is attached to a rearward end of the side plate 14 and has the functions of opening and closing about a peripheral portion of the rearward end of the side plate 14, is positioned on the backboard side of the housing.

Here, the front plate 11 has the functions of opening and closing with respect to the side plate 14. In an open state thereof, the front plate 11 is tilted toward the inner surface of the side plate 14 (toward the bottom of a tray area). Further, in a closed state thereof, the front plate 11 is held in a position for defining the tray area. More specifically, when the front plate 11 is held in the position in which it is perpendicular to the side plate 14, the front plate 11 is in the closed state (FIG. 1 illustrates the closed state).

The top plate 12 comprises a top plate 12a (corresponding to a first top plate) and a top plate 12b (corresponding to a second top plate). The top plate 12a disposed at an outer location is formed with a plurality of openings 12a-1, which are holes having e.g. a circular shape, and is rigidly fixed to a surface of the side plate in a position for defining the tray area. More specifically, the top plate 12a is rigidly fixed to the position in which it is held perpendicular to the side plate 14. A protrusion 12a-2 is formed rearward of the top plate 12a (at the back side thereof), and a card lever 16a is disposed forward of the top plate 12a (at the front side thereof).

Further, the top plate 12b disposed at an inner location is formed with a plurality of openings 12b-1 different in aperture ratio, aperture shape or aperture positions from the openings 12a-1 of the top plate 12a, and has the functions of opening and closing with respect to the side plate 14. The top plate 12b is configured such that in a closed state thereof, the top plate 12b lies on the top plate 12a, whereas in an open state thereof, the top plate 12b is tilted toward the side plate 14 (in FIG. 1, the tray-type structure device 1 as viewed on the left side in the figure illustrates the open state of the top plate 12b, and the tray-type structure device 1 as viewed on the right side in the figure illustrates the closed state of the top plate 12b). The function of the top plate 12 for variably setting the ventilation resistance will be described hereinafter with reference to FIGS. 5A, 5B and 5C.

The bottom plate 13 comprises a bottom plate 13a (corresponding to a first bottom plate) and a bottom plate 13b (corresponding to a second bottom plate). The bottom plate 13a disposed at an outer location is formed with a plurality of openings 13a-1, which are holes having e.g. a circular shape, and is rigidly fixed to a surface of the side plate 14 in a position for defining the tray area. More specifically, the bottom plate 13a is rigidly fixed to the position in which it is held perpendicular to the side plate 14.

A protrusion 13a-2 is formed rearward of the bottom plate 13a (at the back side thereof), and a card lever 16b is disposed forward of the bottom plate 13a (at the front side thereof). At a position further forward of the bottom plate 13a, there is disposed a protrusion 13a-3 (the protrusion 13a-3 will be described hereinafter with reference to FIG. 11).

Further, the bottom plate 13b disposed at an inner location is formed with a plurality of openings 13b-1 different in aperture ratio, aperture shape or aperture positions from the openings 13a-1 of the bottom plate 13a, and has the functions of opening and closing with respect to the side plate 14. The bottom plate 13b is configured such that in a closed state thereof, the bottom plate 13b lies on the bottom plate 13a, whereas in an open state thereof, the bottom plate 13b is tilted toward the side plate 14 (in FIG. 1, the tray-type structure device 1 as viewed on the left side in the figure illustrates the open state of the bottom plate 13b, and the tray-type structure device 1 as viewed on the right side in the figure illustrates the closed state of the bottom plate 13b). The function of the bottom plate 13 for variably setting the ventilation resistance will be described hereinafter with reference to FIGS. 6A, 6B and 6C.

The side plate 14 is positioned on only one of the opposite side surfaces of the tray-type structure device 1 (in FIG. 1, the side plate 14 is positioned on the right side of the tray-type structure device 1, as viewed from the front thereof). A conductive elastic member (e.g. a gasket) 14a is disposed on an outer surface side of the side plate 14 (on the right surface side of the tray-type structure device 1, as viewed from the front thereof). Further, L-shaped protrusions 14b-1 and 14b-2 are arranged forward and rearward of an upper portion of the side plate 14 (the plug-in unit-mounting operation of the L-shaped protrusions 14b-1 and 14b-2 will be described hereinafter with reference to FIG. 9, and an operation for fitting the L-shaped protrusion 14b-1 on the back plate 15 will be described hereinafter with reference to FIGS. 14A and 14B).

Furthermore, one or a plurality of protrusions are arranged on each of the upper and lower portions of the side plate 14. In FIG. 1, protrusions 14c-1 and 14c-2 are arranged on the upper portion of the side plate 14, and protrusions 14c-3 and 14c-4 are arranged on the lower portion of the side plate 14 (the protrusions 14c-1 to 14c-4 will be described hereinafter with reference to FIGS. 5A, 5B and 5C and FIGS. 6A, 6B and 6C).

The back plate 15 is an L-shaped plate which has the functions of opening and closing with respect to the side plate 14, and includes a conductive elastic member 15a and a recess-formed protrusion 15b (the back plate 15 will be described hereinafter with reference to FIG. 12 and FIGS. 13A, 13B and 13C). When the back plate 15 is in an open state, it is in a position tilted toward the outside of the side plate 14 such that the back plate 15 is on the same plane as that of the side plate 14. Further, when the back plate 15 is in a closed state, it is held in a position for defining the tray area. More specifically, when the back plate 15 is in the position, in which it is held perpendicular to the side plate 14, the back plate 15 is in the closed state (FIG. 1 illustrates the closed state).

The tray-type structure device 1 configured as described above forms a space area (tray area) by the front plate 11, the top plate 12, the bottom plate 13, the side plate 14 and the back plate 15, and is configured to be capable of mounting a plug-in unit in the tray area.

When the tray-type structure device 1 has no plug-in unit mounted therein, the tray-type structure device 1 is accommodated in a subrack to prevent imbalance of ventilation. At this time, the front plate 11 and the back plate 15 are in the respective closed states (states perpendicular to the side plate 14), and the open and closed states of the top plate 12 and the bottom plate 13 can be set as desired (the open and closed states are adjusted as desired).

Further, when a plug-in unit is to be accommodated in an empty slot of the subrack which has the tray-type structure device 1 accommodated therein, the plug-in unit is mounted in the tray area of the tray-type structure device 1, and the tray-type structure device 1 having the plug-in unit integrated thereon is accommodated in the subrack. At this time, the front plate 11 and the back plate 15 are in the open states (on the same plane as that of the side plate 14) and normally, the top plate 12 and the bottom plate 13 are in the open states (since ventilation resistance is generated by mounting the plug-in unit in the tray area, in general, the top plate 12b and the bottom plate 13b are held in the open states, but e.g. when the packaging density of electronic circuit elements on the plug-in unit 2 is low, the top plate 12b and the bottom plate 13b may be held in the closed states).

In the conventional filler, when a plug-in unit is accommodated in an empty slot of the subracks, a filler having been accommodated, in the empty slot is discarded, but in the tray-type structure device 1, it is possible to mount the plug-in unit in the tray area of the tray-type structure device 1 and accommodate the tray-type structure device 1 in a state having the plug-in unit integrated thereon in a slot. This makes it unnecessary to discard the tray-type structure device 1 as in the conventional method, and makes it possible to continue the operation while holding the tray-type structure devices 1 accommodated in the subrack, whereby it is possible to suppress an increase in costs and enhance customer convenience.

Figure 2:
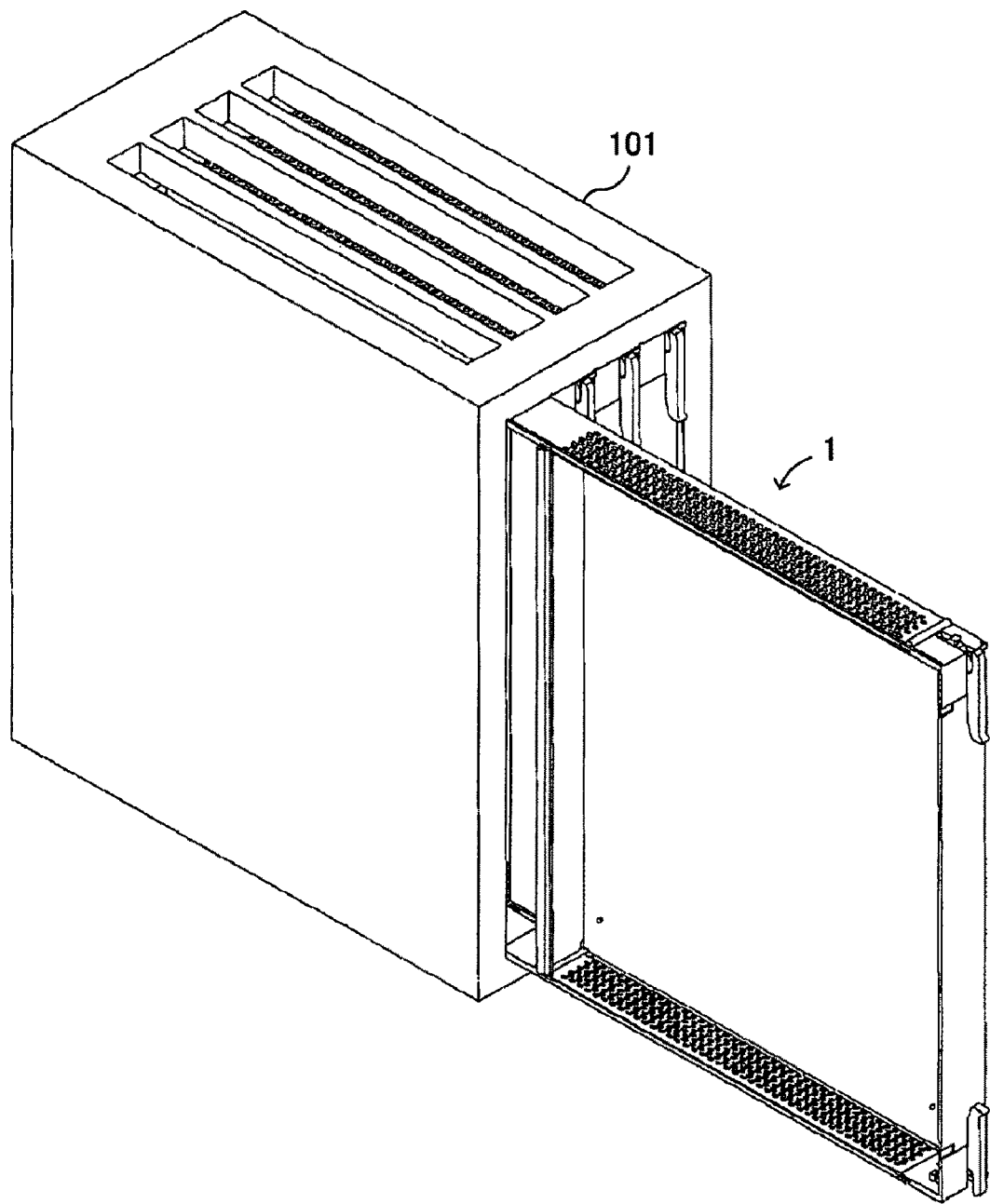
FIG. 2 is a diagram illustrating how the tray-type structure device is accommodated in a subrack.

FIG. 2 is a diagram illustrating how the tray-type structure device 1 is accommodated in the subrack. FIG. 2 illustrates how the tray-type structure device 1 is accommodated in the subrack 101 with no plug-in unit mounted in the tray area of the tray-type structure device 1.

Figure 3:
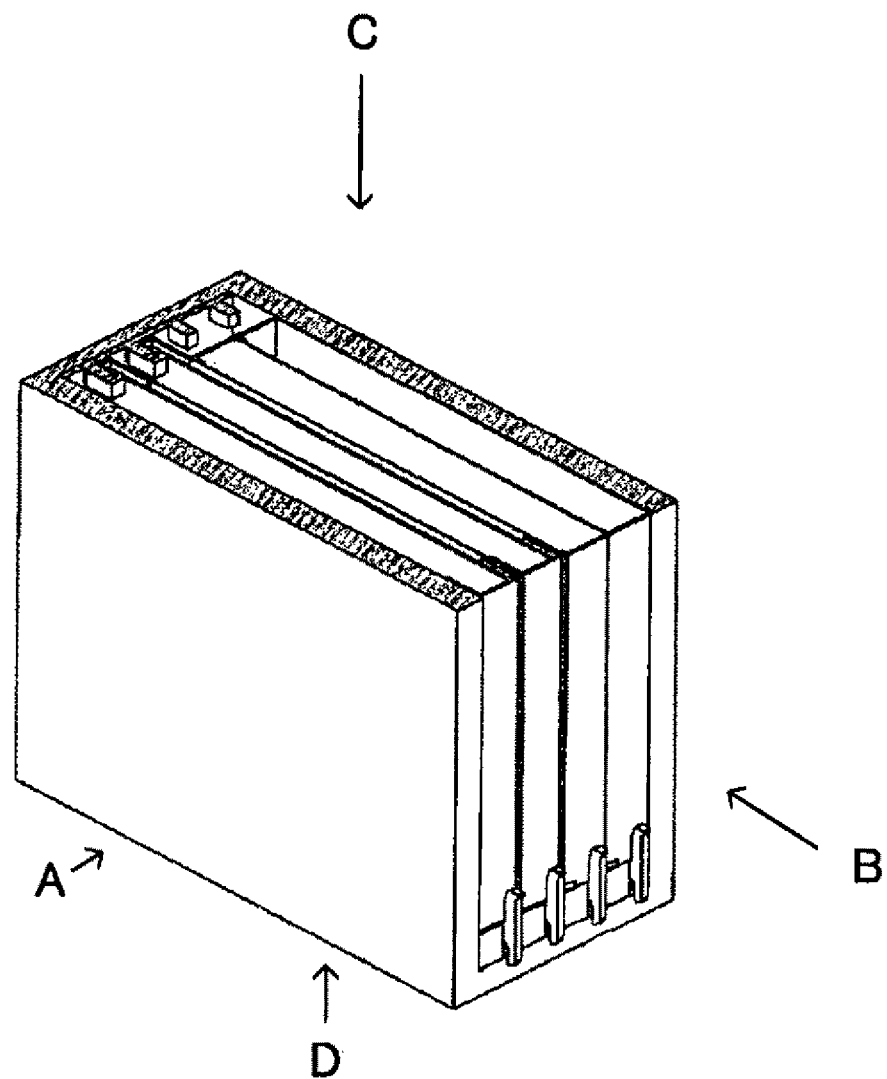
FIG. 3 is a diagram showing a state in which the tray-type structure devices are accommodated in the subrack.
Figure 4C:
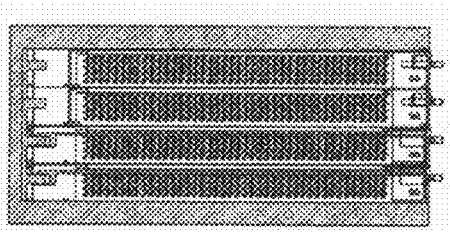
FIGS. 4A to 4D are diagrams of the state in which the tray-type structure devices are accommodated in the subrack, as viewed from directions A to D indicated in FIG. 3.
Figure 4A:
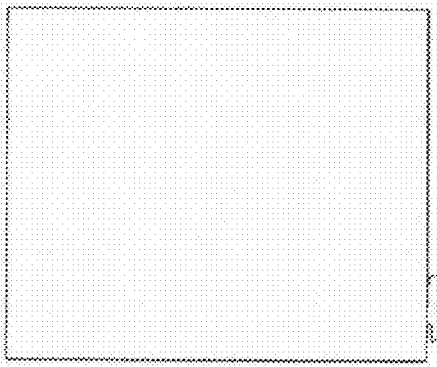
Figure 4B:
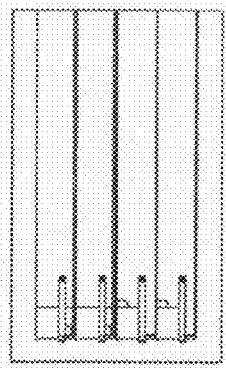
Figure 4D:
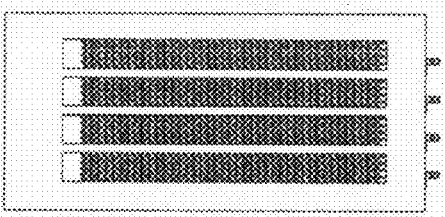

Further, FIG. 3 is a diagram showing a state in which the tray-type structure devices 1 are accommodated in the subrack, i.e. a state in which four tray-type structure devices 1 are accommodated in a subrack having four slots. FIGS. 4A to 4D are diagrams of the state in which the tray-type structure devices 1 are accommodated in the subrack, as viewed from directions A to D indicated in FIG. 3.

Figure 5C:
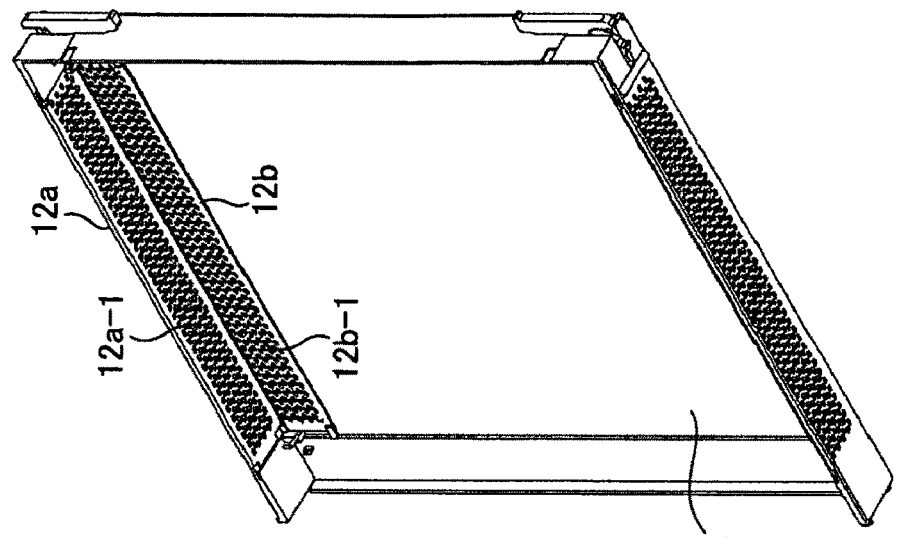
FIGS. 5A, 5B and 5C are diagrams of opening and closing operations of a top plate.
Figure 5B:
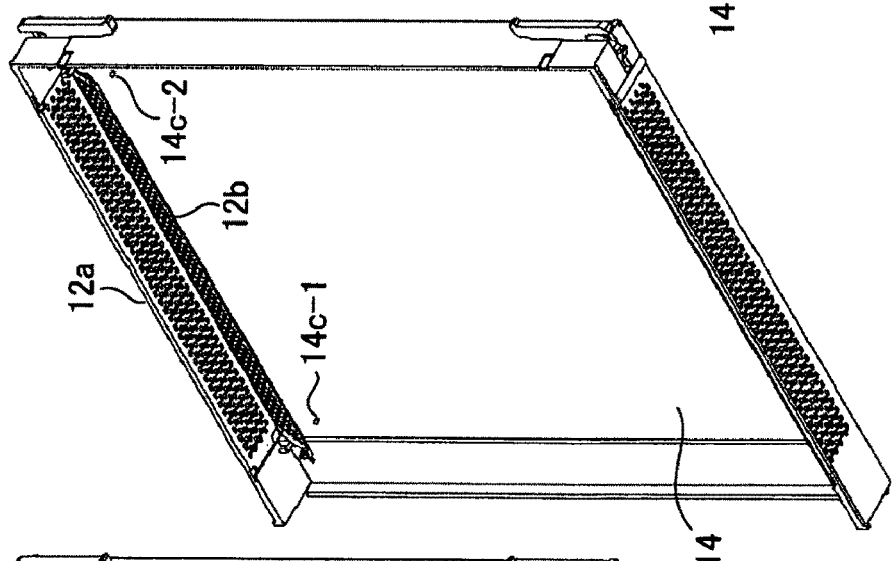
Figure 5A:
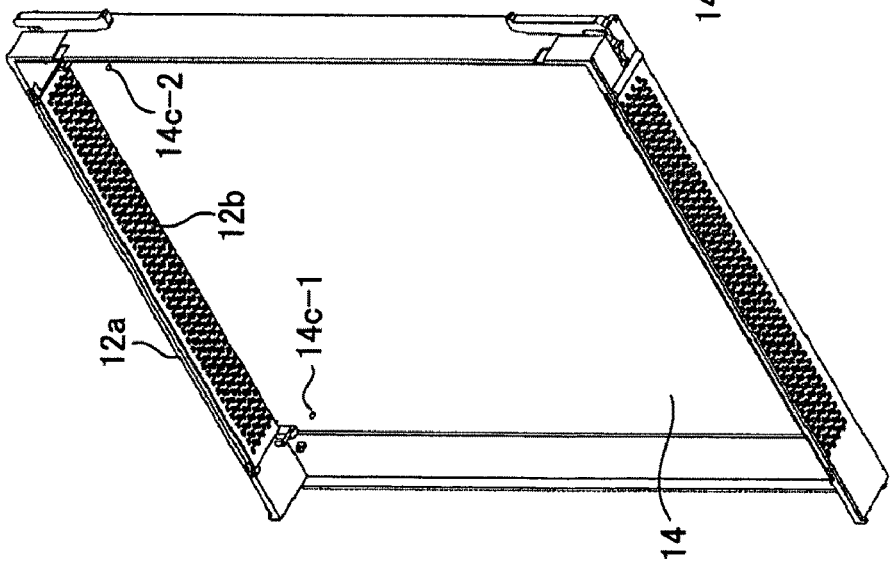

Next, a description will be given of the top plate 12 and the bottom plate 13. FIGS. 5A, 5B and 5C are diagrams illustrating opening and closing operations of the top plate 12b. FIG. 5A illustrates a state in which the top plate 12b is closed and lies on the top plate 12a. FIG. 5B illustrates a state in which the top plate 12b has been rotated downward through approximately 60 degrees. FIG. 5C illustrates a state in which the top plate 12b is opened and brought into contact with the side plate 14.

Since ventilation resistance is increased by closing the top plate 12b such that the top plate 12b lies on the top plate 12a, as illustrated in FIG. 5A, air blowing against the top plates 12a and 12b flows into the other slots, whereby it is possible to send a larger amount of forced air draft from cooling fans to plug-in units accommodated in the other slots.

Further, if the top plate 12b is opened (placed on the same plane as that of the side plate 14), as illustrated in FIG. 5C, it is also possible to reduce the ventilation resistance to cause a larger amount of forced air draft to flow into a unit (tray-type structure device 1) including the top plates 12a and 12b. The opening and closing functions of the top plate 12b make it possible to adjust the amount of forced air draft sent to the other plug-in units mounted in the subrack (ventilation resistance adjustment).

On the other hand, the protrusions 14c-1 and 14c-2 are formed on the surface of the side plate 14. The protrusions 14c-1 and 14c-2 each have a protruding shape slightly larger than the shape of the openings 12b-1 of the top plate 12b, which is formed such that a foremost end thereof has a spherical shape, for example.

When the top plate 12b is opened and tilted toward the side plate 14, it is possible to hold the top plate 12b in the open state by press-fitting the openings 12b-1 of the top plate 12b into the protrusions 14c-1 and 14c-2 of the side plate 14 (a holding mechanism for holding the top plate 12b in a state lying on the top plate 12a, as illustrated in FIG. 5A, will be described with reference to FIGS. 8A and 8B).

The openings 12a-1 formed in the top plate 12a and the openings 12b-1 formed in the top plate 12b are not limited in shape, size, number, and position. The thickness of the top plates 12a and 12b is not limited, either.

Further, the top plate 12b has not only the air draft adjustment function but also a fire prevention function by being held in the state lying on the top plate 12a, which makes it difficult for a fire to spread out of a plug-in unit even if the plug-in unit starts the fire when in a state mounted in the tray area and accommodated in the subrack.

FIGS. 6A, 6B and 6C are diagrams illustrating opening and closing operations of the bottom plate 13b. FIG. 6A illustrates a state in which the bottom plate 13b is closed and lies on the bottom plate 13a. FIG. 6B illustrates a state in which the bottom plate 13b has been rotated upward through approximately 60 degrees. FIG. 6C illustrates a state in which the bottom plate 13b is opened and brought into contact with the side plate 14.

Since the ventilation resistance is increased by closing the bottom plate 13b such that it lies on the bottom plate 13a, as illustrated in FIG. 6A, air blowing against the bottom plates 13a and 13b flows into the other slots, whereby it is possible to send a larger amount of forced air draft from the cooling fans to plug-in units accommodated in the other slots.

Further, by opening the bottom plate 13b (such that it is on the same plane as that of the side plate 14), as illustrated in FIG. 6C, it is also possible to reduce the ventilation resistance to cause a larger amount of forced air draft to flow into a unit (tray-type structure device 1) including the bottom plates 13a and 13b. The opening and closing functions of the bottom plate 13b make it possible to adjust the amount of forced air draft sent to the other plug-in units mounted in the subrack (ventilation resistance adjustment).

On the other hand, the protrusions 14c-3 and 14c-4 are formed on the surface of the side plate 14. The protrusions 14c-3 and 14c-4 each have a protruding shape slightly larger than the shape of the openings 13b-1 of the top plate 13b, which is formed such that a foremost end thereof has a spherical shape, for example.

When the bottom plate 13b is opened and tilted toward the side plate 14, it is possible to hold the bottom plate 13b in the open state by press-fitting the openings 13b-1 of the bottom plate 13b into the protrusions 14c-3 and 14c-4 of the side plate 14 (the holding mechanism for holding the bottom plate 13b in a state lying on the bottom plate 13a, as illustrated in FIG. 6A, will be described with reference to FIGS. 8A and 8B).

The openings 13a-1 formed in the bottom plate 13a and the openings 13b-1 formed in the bottom plate 13b are not limited in shape, size, number, and position. The thickness of the bottom plates 13a and 13b is not limited, either.

Further, the bottom plate 13b has not only the air draft adjustment function but also a fire prevention function by being held in the state lying on the bottom plate 13a, which makes it difficult for a fire to spread out of a plug-in unit even if the plug-in unit starts the fire when in a state mounted in the tray area and accommodated in the subrack.

Next, an operation for mounting the plug-in unit on the tray-type structure device 1 will be described. First, a description will be given of a case in which the tray-type structure device 1 is pulled out from the subrack.

Figure 7:
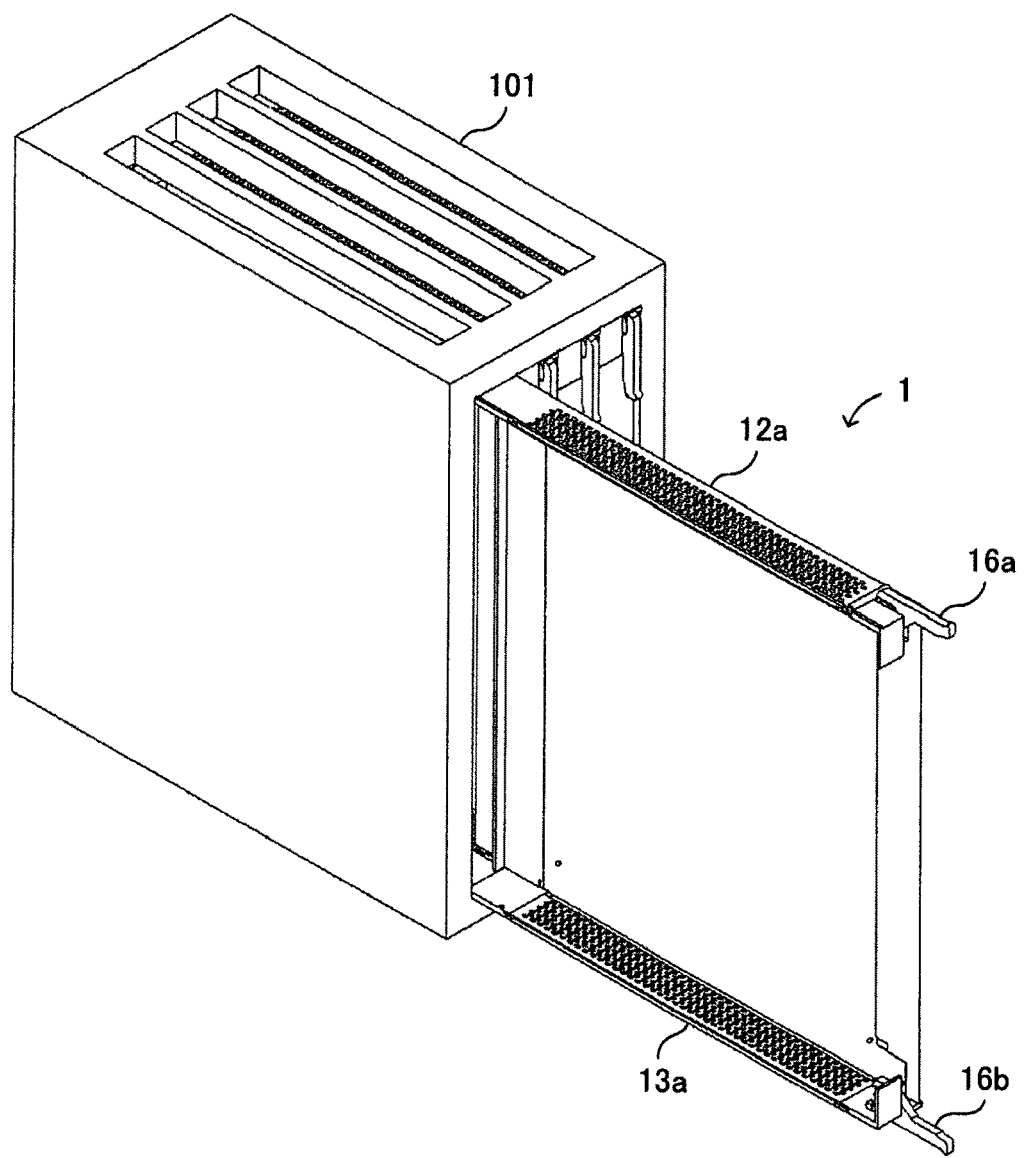
FIG. 7 is a diagram showing a state in which the tray-type structure device is being pulled out from the subrack.

FIG. 7 illustrates a state in which the tray-type structure device 1 is being pulled out from the subrack. The tray-type structure device 1 (in a state in which no plug-in unit is mounted thereon) is pulled out from the subrack 101 by operating the card lever 16a disposed on the top plate 12a of the tray-type structure device 1 and the card lever 16b disposed on the bottom plate 13a thereof.

Here, as illustrated in FIG. 1, the protrusion 12a-2 is formed rearward of the top plate 12a, and the protrusion 13a-2 is formed rearward of the bottom plate 13a.

When the tray-type structure device 1 is pulled out, it has the protrusions 12a-2 and 13a-2 thereof engaged with the front face of the subrack such that it is held thereat, whereby the tray-type structure device 1 is prevented from dropping off the subrack.

Figure 8A:
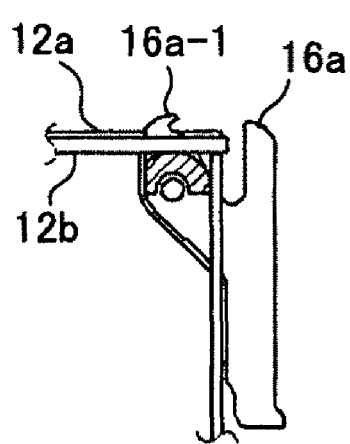
FIGS. 8A and 8B are diagrams of states of a card lever being operated.
Figure 8B:
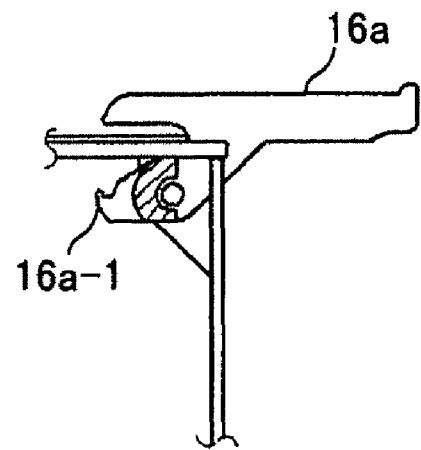

FIGS. 8A and 8B are diagrams illustrating the states of the card lever 16a being operated. FIGS. 8A and 8B illustrate the card lever 16a disposed on the top plate 12, in which FIG. 8A illustrates a state in which the tray-type structure device 1 is fixed, and FIG. 8B illustrates a state in which the tray-type structure device 1 is released.

When the tray-type structure device 1 is accommodated in the subrack and is fixed thereto, as illustrated in FIG. 8A, the card lever 16a is pushed in toward the subrack to fit a protrusion 16a-1 in the front face of the subrack. At this time, the opening and closing functions of the front plate 11 are also fixed by a protrusion of the fixed card lever 16a (the front plate 11 is held in the closed state (state perpendicular to the side plate 14)).

Further, when the card lever 16a is pushed in the state in which the top plate 12a and the top plate 12b are closed one upon the other, the protrusion 16a-1 extend through one of the openings 12a-1 of the top plate 12a and one of the openings 12b-1 of the top plate 12b so as to be fitted in the front face of the subrack, so that the card lever 16a also plays the role of a holding mechanism for holding the top plate 12b in a state lying on the top plate 12a.

On the other hand, as illustrated in FIG. 8B, when the tray-type structure device 1 is pulled out from the subrack, the card lever 16a is pushed up for operation. At this time, the card lever 16a moves away from the front plate 11, so that it is possible to perform the opening and closing operations of the front plate 11. Further, when the card lever 16a is pushed up, the protrusion 16a-1 is pulled out from the one of the openings 12a-1 of the top plate 12a and the one of the openings 12b-1 of the top plate 12b, which also makes it possible to perform the opening and closing operations of the top plate 12b. The card lever 16b has the same construction as that of the card lever 16a, and when the tray-type structure device 1 is inserted into or pulled out from the subrack, the card lever 16b is only required to be operated in the same manner as the card lever 16a is, so that detailed description of the card lever 16b is omitted.

Next, the front plate 11, the top plate 12b and the bottom plate 13b are opened (and tilted toward the side plate 14) in the state in which the tray-type structure device 1 is pulled out from the subrack, the back plate 15 is opened toward the outside of the tray-type structure device 1 (the open and closed states of the back plate will be described with reference to FIGS. 13A, 13B and 13C and FIGS. 14A and 14B). Then, a plug-in unit is mounted in the tray area of the tray-type structure device 1 in a state in which the front plate 11, the top plate 12b, the bottom plate 13b and the back plate 15 are open.

Figure 9:
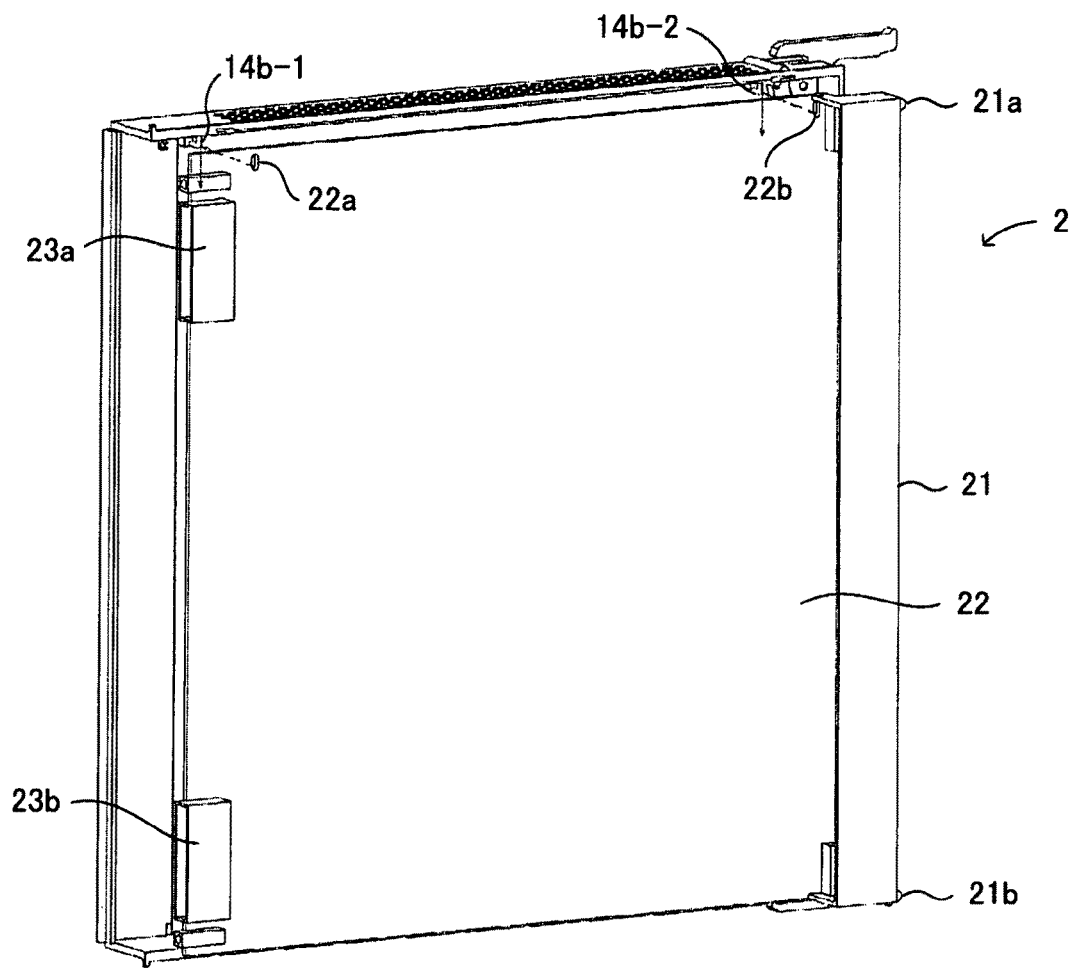
FIG. 9 is a diagram illustrating how a plug-in unit is mounted in the tray-type structure device.

FIG. 9 is a diagram illustrating how the plug-in unit is mounted in the tray-type structure device 1. The plug-in unit 2 includes a surface plate 21 and a printed wiring board 22 having electronic circuit elements mounted thereon. Connectors 23a and 23b for being connected to connectors mounted on the backboard are arranged rearward of the printed wiring board 22, and open holes 22a and 22b are arranged in an upper portion of the printed wiring board 22.

Further, an open hole (not illustrated) is formed in the bottom of the surface plate 21, and conductive elastic members 21a and 21b are arranged at respective locations of upper and lower portions of the surface plate 21, which come into contact with the side plate 14. During mounting of the plug-in unit 2 in the tray-type structure device 1, the conductive elastic members 21a and 21b are pressed against the surface of the side plate 14 of the tray-type structure device 1.

Figure 10:
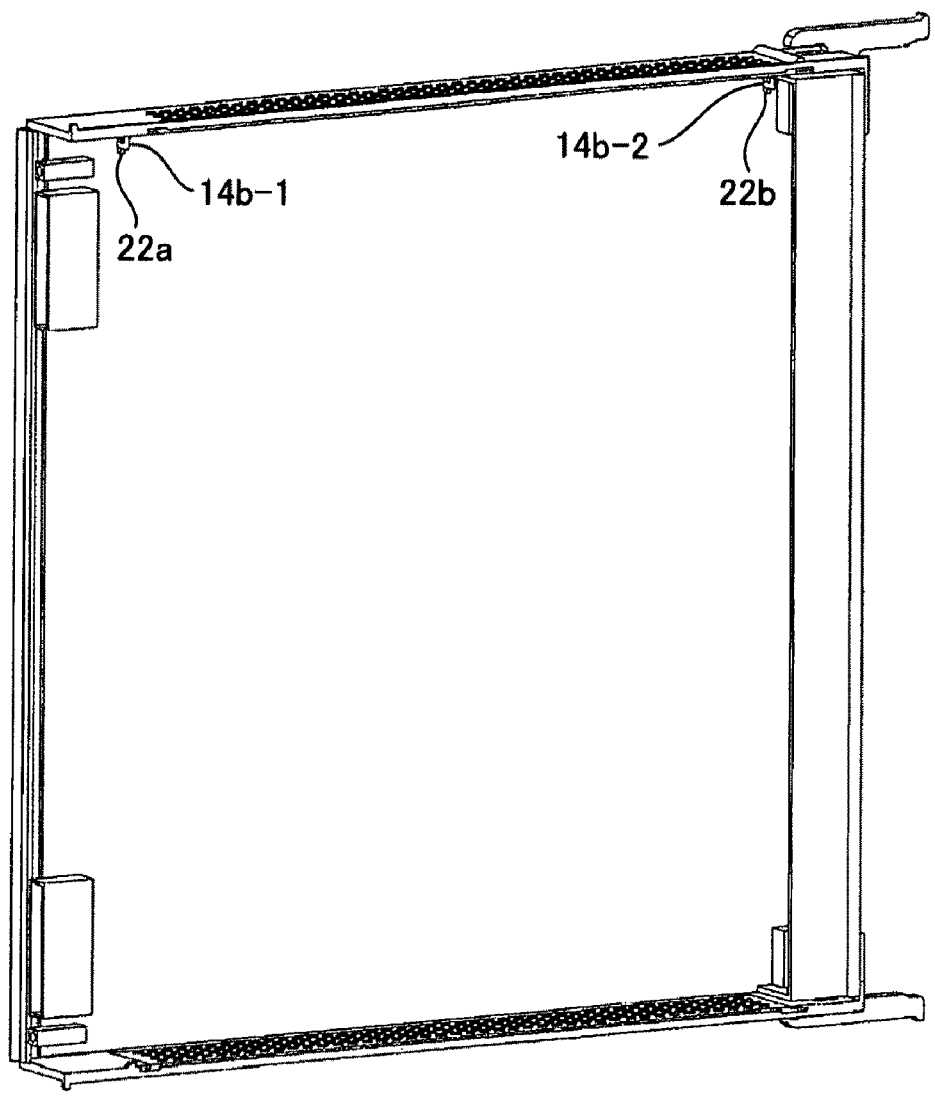
FIG. 10 is a diagram illustrating how L-shaped protrusions are inserted into open holes of the plug-in unit.

FIG. 10 is a diagram illustrating how the L-shaped protrusions 14b-1 and 14b-2 are inserted into the open holes 22a and 22b of the plug-in unit 2. As illustrated in FIG. 1, the side plate 14 is formed with the L-shaped protrusions 14b-1 and 14b-2. After the open holes 22a and 22b of the plug-in unit 2 are positioned to the respective L-shaped protrusions 14b-1 and 14b-2, the L-shaped protrusions 14b-1 and 14b-2 are inserted into the open holes 22a and 22b while slightly rotating the plug-in unit 2 from upward toward the side plate 14 about the L-shaped protrusions 14b-1 and 14b-2.

Figure 11:
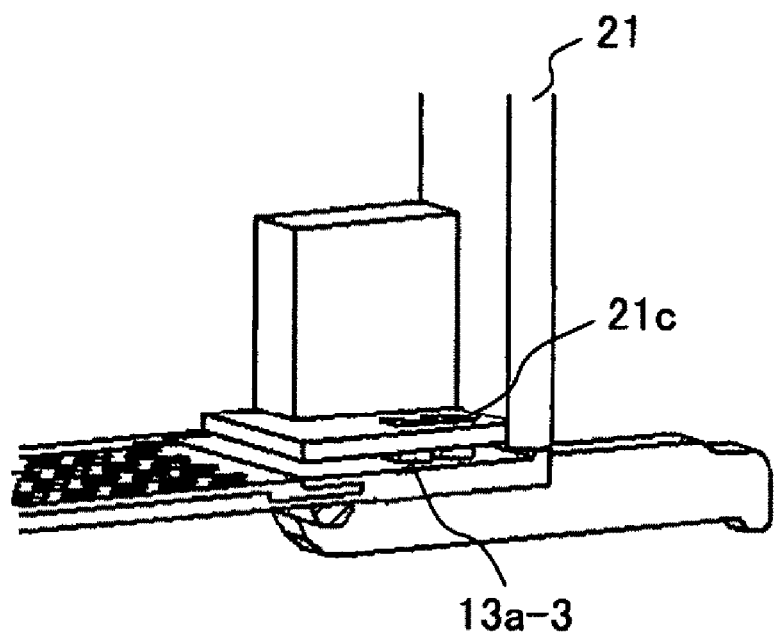
FIG. 11 is a diagram illustrating how an open hole formed in the bottom of a surface plate and a protrusion are fitted to each other.

FIG. 11 is a diagram illustrating how an open hole formed in the bottom of the surface plate 21 and the protrusion 13a-3 are fitted to each other. When the L-shaped protrusions 14b-1 and 14b-2 are inserted into the open holes 22a and 22b of the plug-in unit 2, the plug-in unit 2 is slightly slid downward when in a location parallel to the side plate 14. This causes an open hole 21c formed in the bottom of the surface plate 21 of the plug-in unit 2 to be fitted on the protrusion 13a-3, appearing in FIG. 1, formed on the bottom plate 13a. Thus, the plug-in unit 2 has its upper portion held by the L-shaped protrusions 14b-1 and 14b-2 of the side plate 14 and its lower portion held by the protrusion 13a-3 of the bottom plate 13 (the fitting relationship between the open hole 21c and the protrusion 13a-3 will be described hereinafter with reference to FIG. 16).

When the plug-in unit 2 is mounted in the tray-type structure device 1, the tray-type structure device 1 is slid and inserted into the subrack, and the connectors 23a and 23b of the plug-in unit 2 are fitted to connectors on the backboard side, whereby the tray-type structure device 1 having the plug-in unit 2 integrated thereon are accommodated in the subrack.

Figure 12:
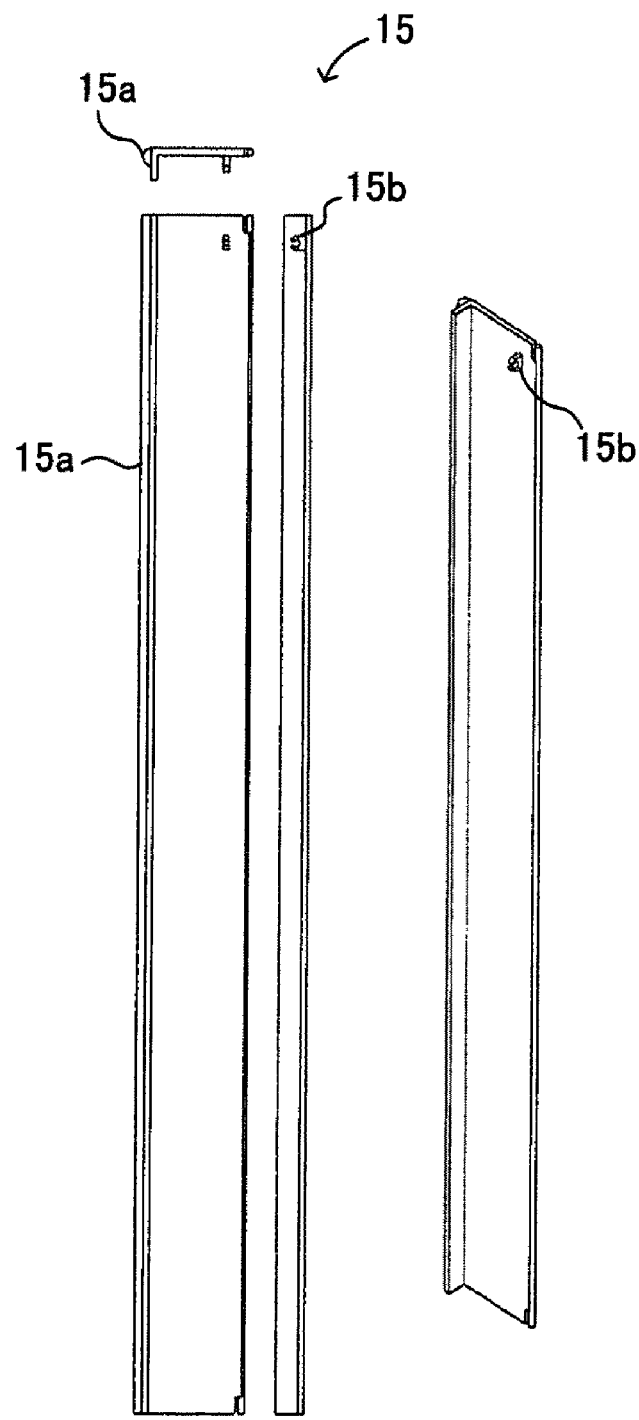
FIG. 12 is a diagram of a back plate.

Next, a description will be given of the configuration of operation of the back plate 15. FIG. 12 is a diagram of the back plate 15. The back plate 15 is an L-shaped plate which has the recess-formed protrusion 15b formed on an upper portion of inner surface thereof and the conductive elastic member 15a formed on an L-shaped bottom thereof.

Figure 13:
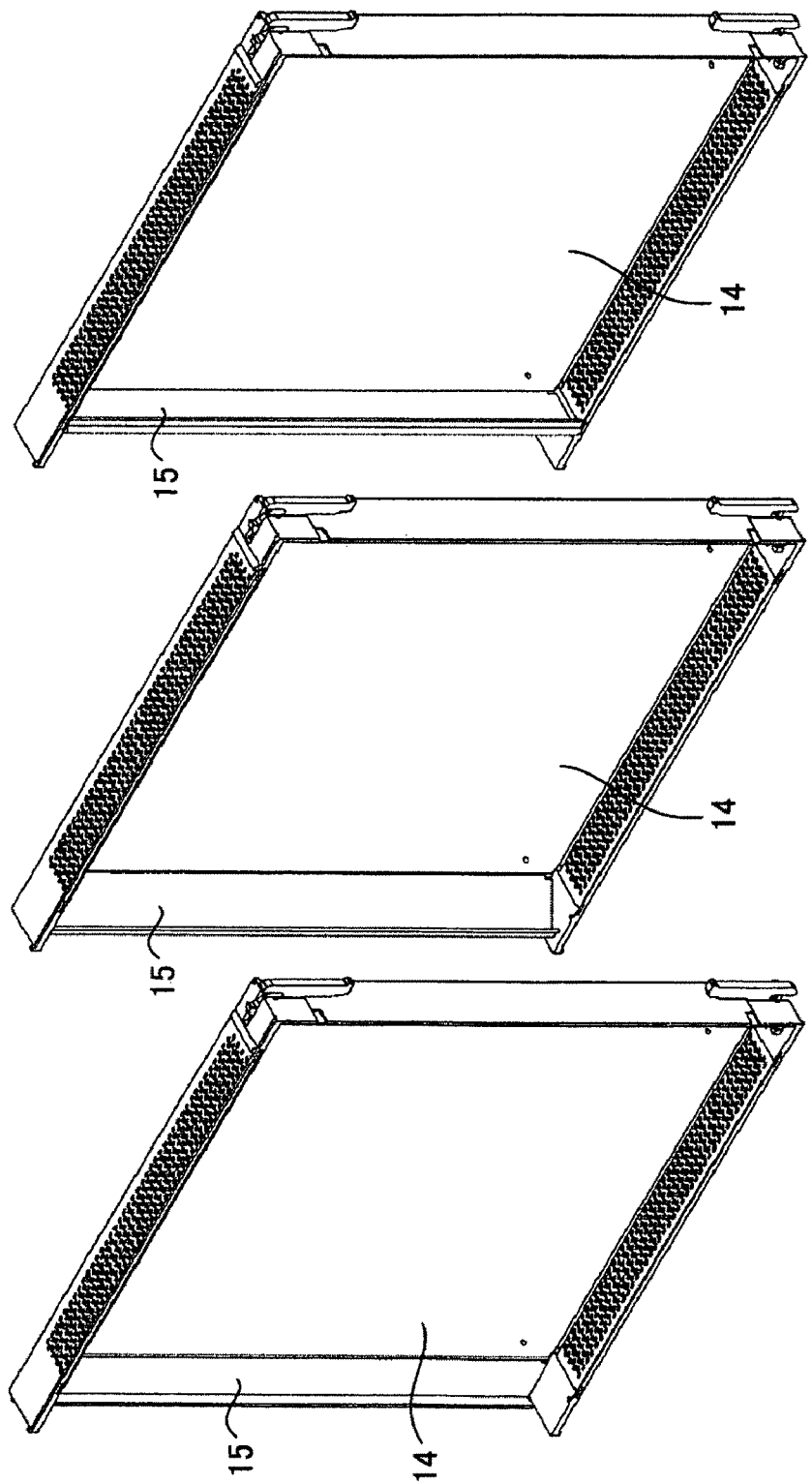
FIGS. 13A, 13B and 13C are diagrams of open and closed states of the back plate.

FIGS. 13A, 13B and 13C are diagrams of the open and closed states of the back plate 15. FIG. 13A illustrates a state in which the back plate 15 is opened. FIG. 13B illustrates a state in which the back plate 15 has been rotated through approximately 45 degrees (risen from the side plate 14 at approximately 45 degrees). FIG. 13C illustrates a state in which the back plate 15 is closed.

When the plug-in unit 2 is not inserted into the tray area of the tray-type structure device 1, as illustrated in FIG. 13C, the back plate 15 is held in the closed state (state perpendicular to the side plate 14). In this positional state, the back plate 15 serves as a lid of the connectors on the backboard side, and has a dust-proof function for the backboard connectors.

Further, when the plug-in unit 2 is inserted into the tray area of the tray-type structure device 1, the back plate 15 is moved from the state illustrated in FIG. 13B to the state illustrated in FIG. 13A, so as to be held in the open state (on the same plane as that of the side plate 14). In this positional state, the connectors 23a and 23b of the plug-in unit 2 can be fitted to the backboard connectors. Further, the conductive elastic member 15a included in the back plate 15 is brought into contact with a GND pattern of the backboard.

Figure 14:
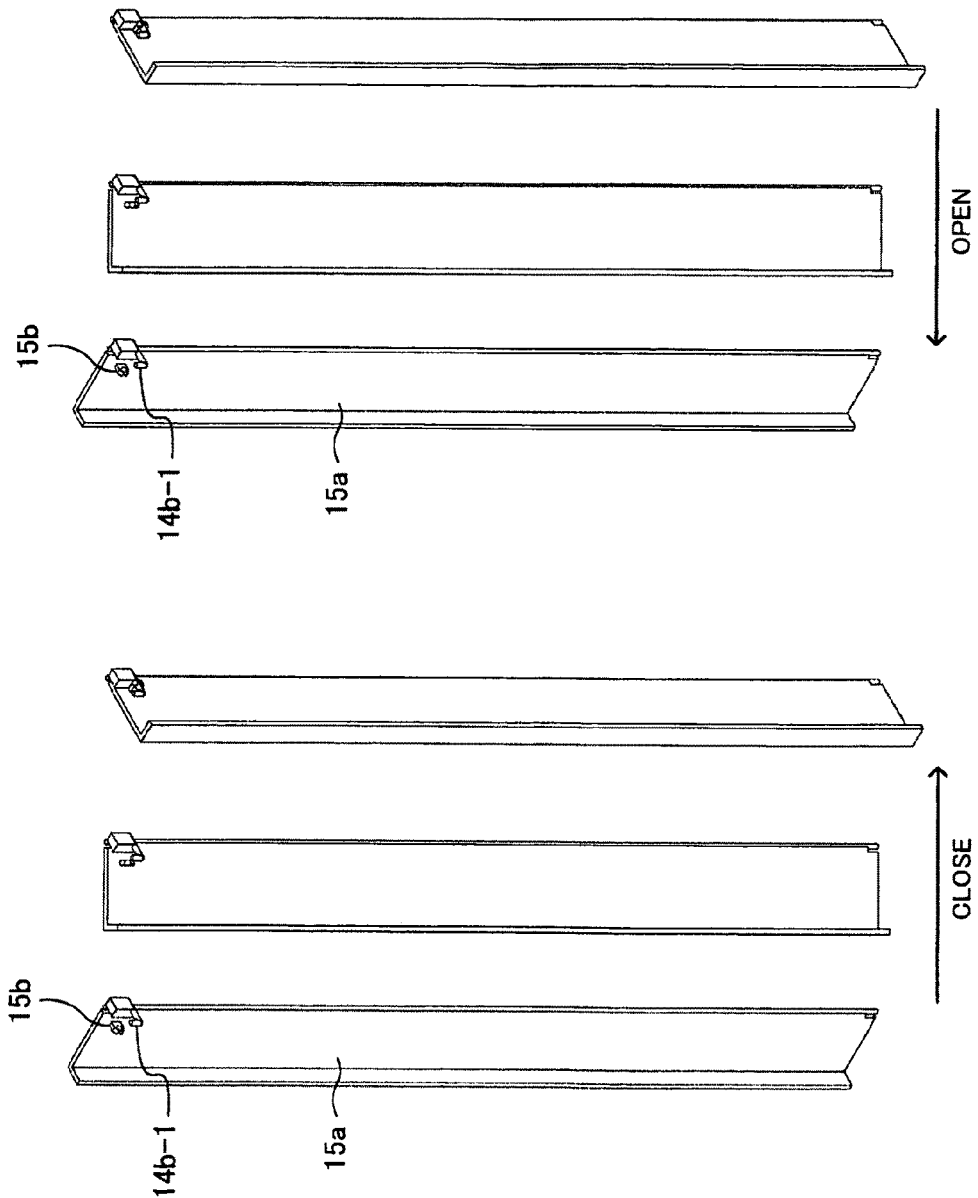
FIGS. 14A and 14B are diagrams of the open and closed states of the back plate.

FIGS. 14A and 14B are diagrams illustrating the open and closed states of the back plate 15. FIG. 14A illustrates how the back plate 15 is closed. FIG. 14B illustrates how the back plate 15 is opened. As illustrated in FIG. 14A, when the back plate 15 is closed, the recess-formed protrusion 15b of the back plate 15 and the L-shaped protrusion 14b-1 of the side plate 14 are fitted to each other, whereby the back plate 15 is held in a position in which it is perpendicular to the side plate 14. Further, as illustrated in FIG. 14B, when the back plate 15 is opened, the recess-formed protrusion 15b of the back plate 15 and the L-shaped protrusion 14b-1 of the side plate 14 are removed from each other, whereby the back plate 15 is opened.

Figure 15:
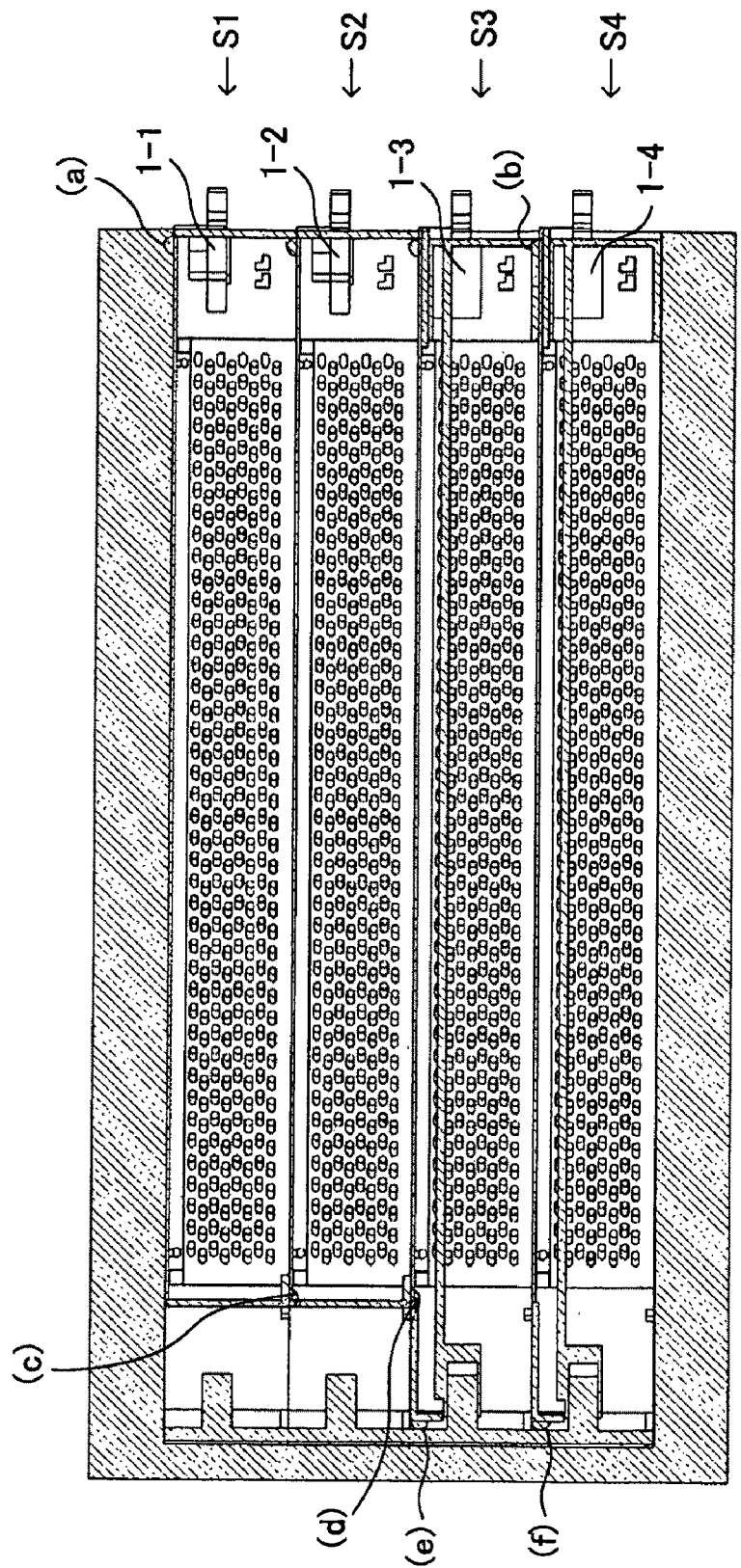
FIG. 15 is a diagram illustrating an example of a state in which a shield structure is formed.

Next, a description will be given of formation of a shield structure. FIG. 15 is a diagram illustrating an example of a state in which a shield structure is formed. Tray-type structure devices 1-1 and 1-2 having no plug-in units 2 mounted therein are accommodated in slots S1 and S2 of the subrack, respectively, and tray-type structure devices 1-3 and 1-4 having the plug-in units 2 mounted therein are accommodated in slots S3 and S4 of the subrack, respectively. The right side as viewed in FIG. 15 indicates a side from which the plug-in units are inserted, and the left side as viewed in the figure indicates the backboard side.

It is understood that the back plates 15 of the respective tray-type structure devices 1-1 and 1-2 are closed and serve as the lids of the backboard connectors. Further, it is understood that the back plates 15 of the respective tray-type structure devices 1-3 and 1-4 are opened and in contact with the backboard.

In the above accommodated states of the tray-type structure devices, the conductive elastic member 14a disposed on the side plate 14 of the tray-type structure device 1-1 is in electrical contact with the subrack (a). The conductive elastic member 14a disposed on the side plate 14 of the tray-type structure device 1-4 is connected to the surface plate of the plug-in unit 2 inserted into the tray-type structure device 1-3 (b).

The conductive elastic member 15a of the back plate 15 of the tray-type structure device 1-1 is connected to the side plate 14 of the tray-type structure device 1-2 (c); the conductive elastic member 15a of the back plate 15 of the tray-type structure device 1-2 is connected to the side plate 14 of the tray-type structure device 1-3 (d); the conductive elastic member 15a of the back plate 15 of the tray-type structure device 1-3 is connected to the GND pattern of the backboard (e); and the conductive elastic member 15a of the back plate 15 of the tray-type structure device 1-4 is connected to the GND pattern of the backboard (f).

As described above, during accommodation of the tray-type structure device 1 in the subrack, the conductive elastic member 15a provided on the back plate 15 is pressed against the GND pattern on the surface of the backboard, and the conductive elastic member 14a attached to the side plate 14 of the tray-type structure device 1 is also brought into contact with an adjacent tray-type structure device 1. Further, the conductive elastic member provided in the surface plate of the plug-in unit 2 is brought into contact with the side plate 14 of the tray-type structure device 1.

As a consequence, shield structures are formed between a tray-type structure device 1 and the backboard, between the tray-type structure device 1 and plug-in units 2, and between the tray-type structure device 1 and an adjacent tray-type structure device 1, in a manner connected to each other, so that it is possible to form a shield structure for the whole subrack, whereby it is possible to prevent the plug-in units 2 from receiving or emitting EMI to thereby improve EMI (Electro Magnetic Interference) characteristics.

Next, a description will be given of the function of preventing erroneous insertion of the plug-in unit 2. Normally, a plurality of kinds of plug-in units 2 are mounted in the subrack. In this case, it is predetermined which plug-in units 2 are to be accommodated in respective slots.

When a tray-type structure device 1 having no plug-in unit 2 mounted, therein is accommodated in the subrack, there is no problem which slot may accommodate the tray-type structure device 1, but when a tray-type structure device 1 having a plug-in unit 2 mounted therein is accommodated in the subrack, it is necessary to mount the plug-in unit 2 in a determined slot, and hence it is required to provide in advance the tray-type structure device 1 with the function of preventing erroneous insertion of the plug-in unit 2 so as to prevent the plug-in unit 2 from being mounted at a wrong location of the subrack.

Figure 16:
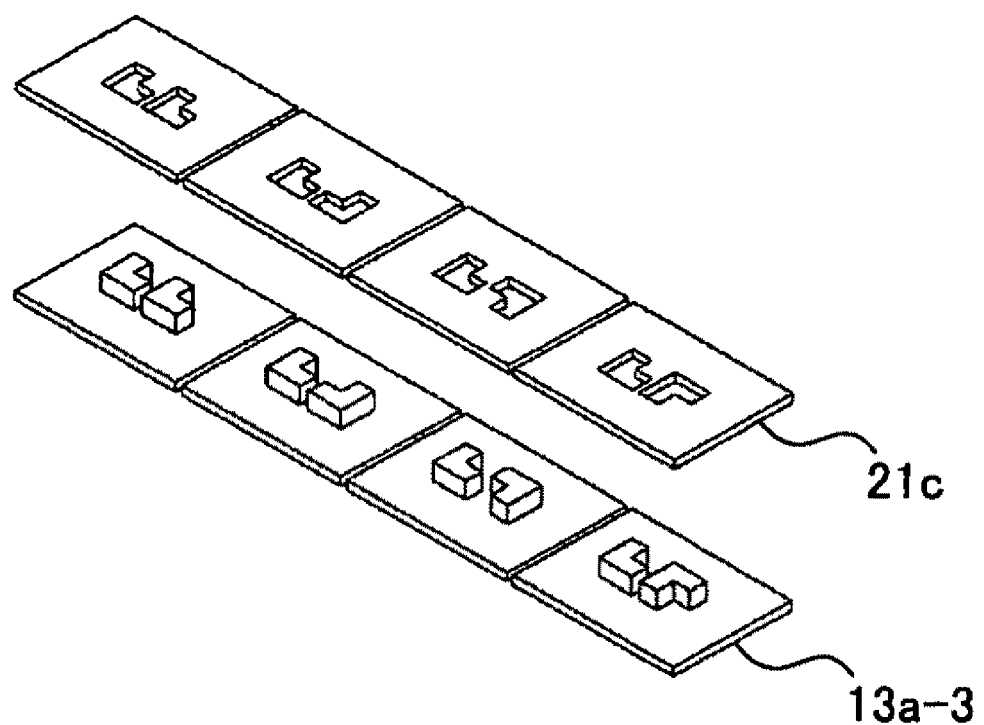
FIG. 16 is a diagram illustrating an example of a function of preventing erroneous insertion of the plug-in unit.

FIG. 16 is a diagram illustrating an example of the function of preventing erroneous insertion of the plug-in unit 2. More specifically, FIG. 16 illustrates examples of the shape of the protrusion 13a-3 formed on the bottom plate 13a of the tray-type structure device 1, and the shape of the open hole 21c in the surface plate 21 of the plug-in unit 2, which is fitted to the protrusion 13a-3 (FIG. 16 illustrates a case in which the plug-in unit 2 is accurately inserted into the tray-type structure device 1). The protrusion 13a-3 is configured such that the shape, the number, the position, and so forth of the protrusion 13a-3 can be changed in association with the open hole 21c, whereby erroneous insertion of the plug-in unit 2 into the tray-type structure device 1 is prevented. The erroneous insertion of the plug-in unit 2 can be prevented not only by the shape, but also by a desired combination of the shape, the number, the position, and so forth.

Next, a description will be given of a variation of the tray-type structure device. Depending on a system configuration, there is provided a housing which has an air filter or the like disposed at an upper portion or a lower portion of the subrack such that the housing has the function of sufficiently preventing dust or dirt from flowing into the subrack.

Figure 17:
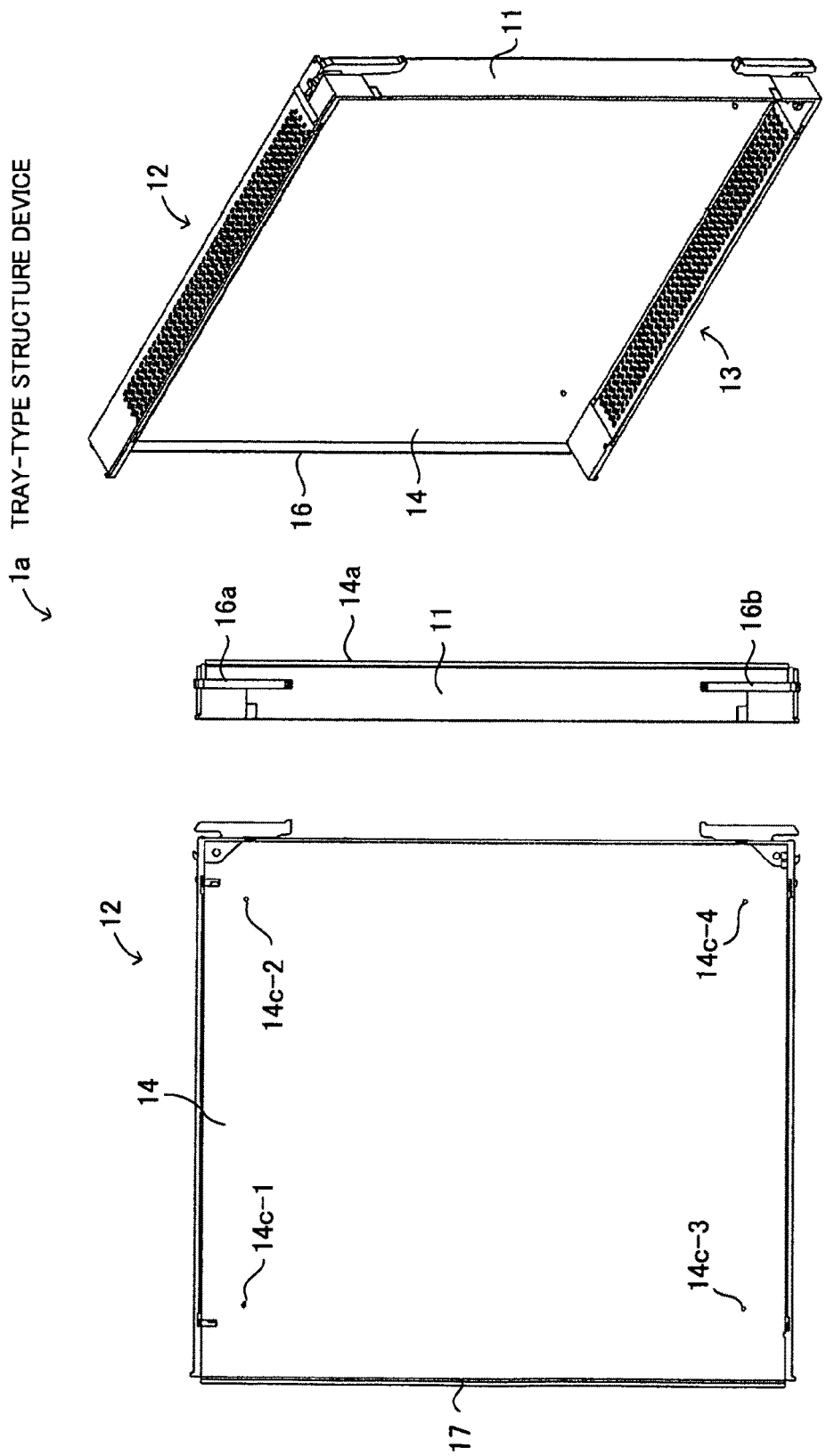
FIG. 17 is a diagram of a variation of a tray-type structure device.
Figure 18:
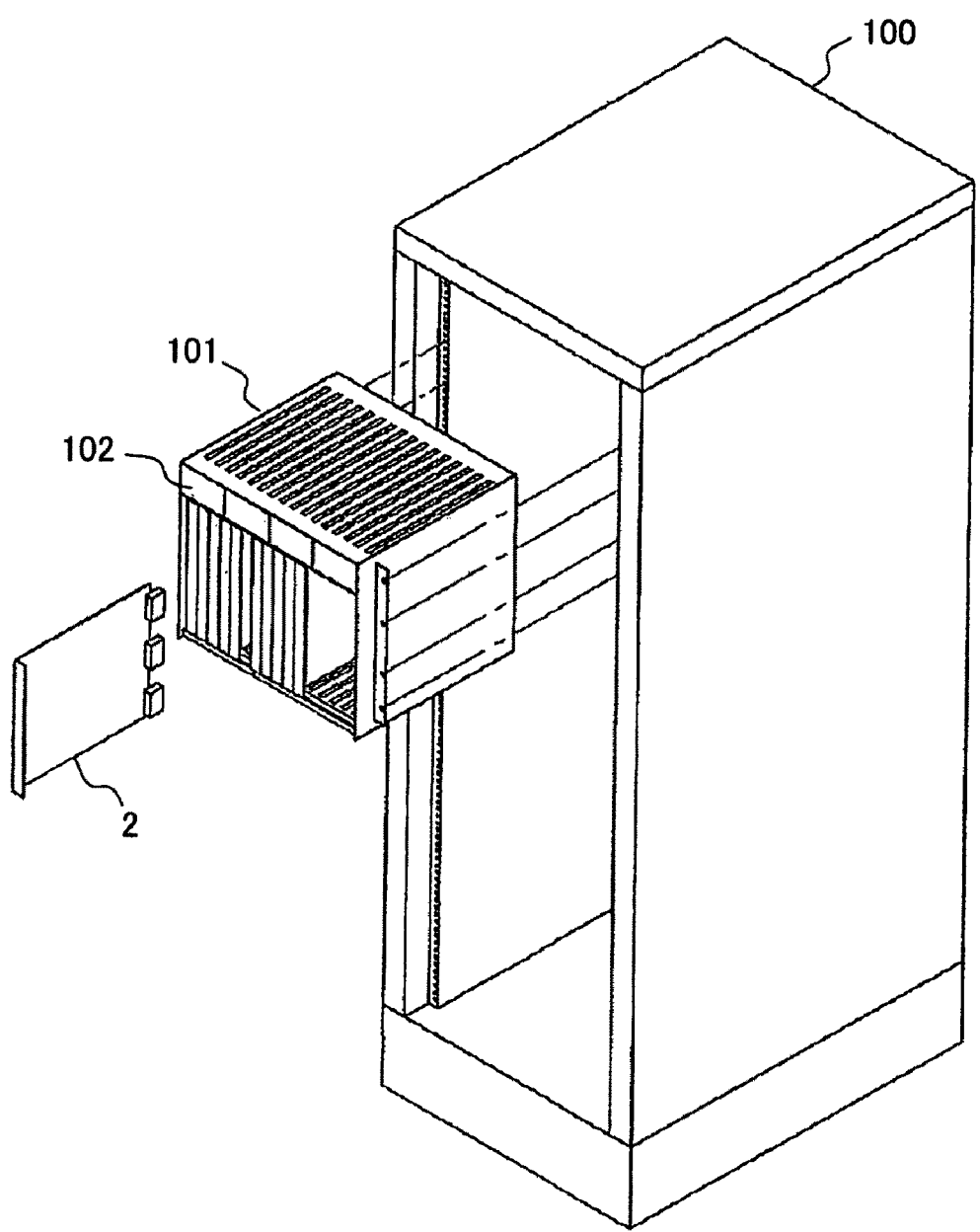
FIG. 18 is a diagram of the whole of a housing.
Figure 19:
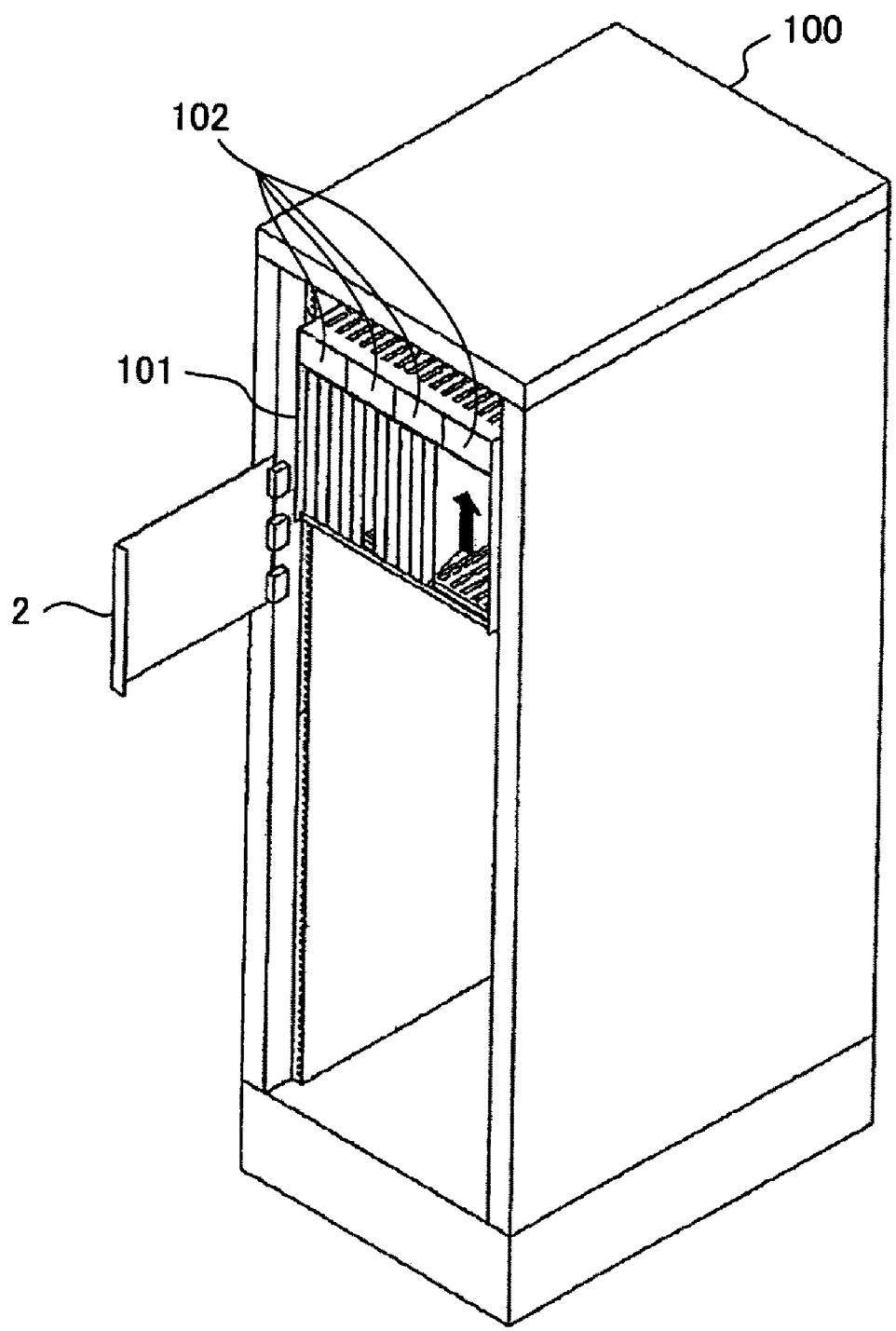
FIG. 19 is a diagram of the whole of the housing.
Figures 20A, 20B:
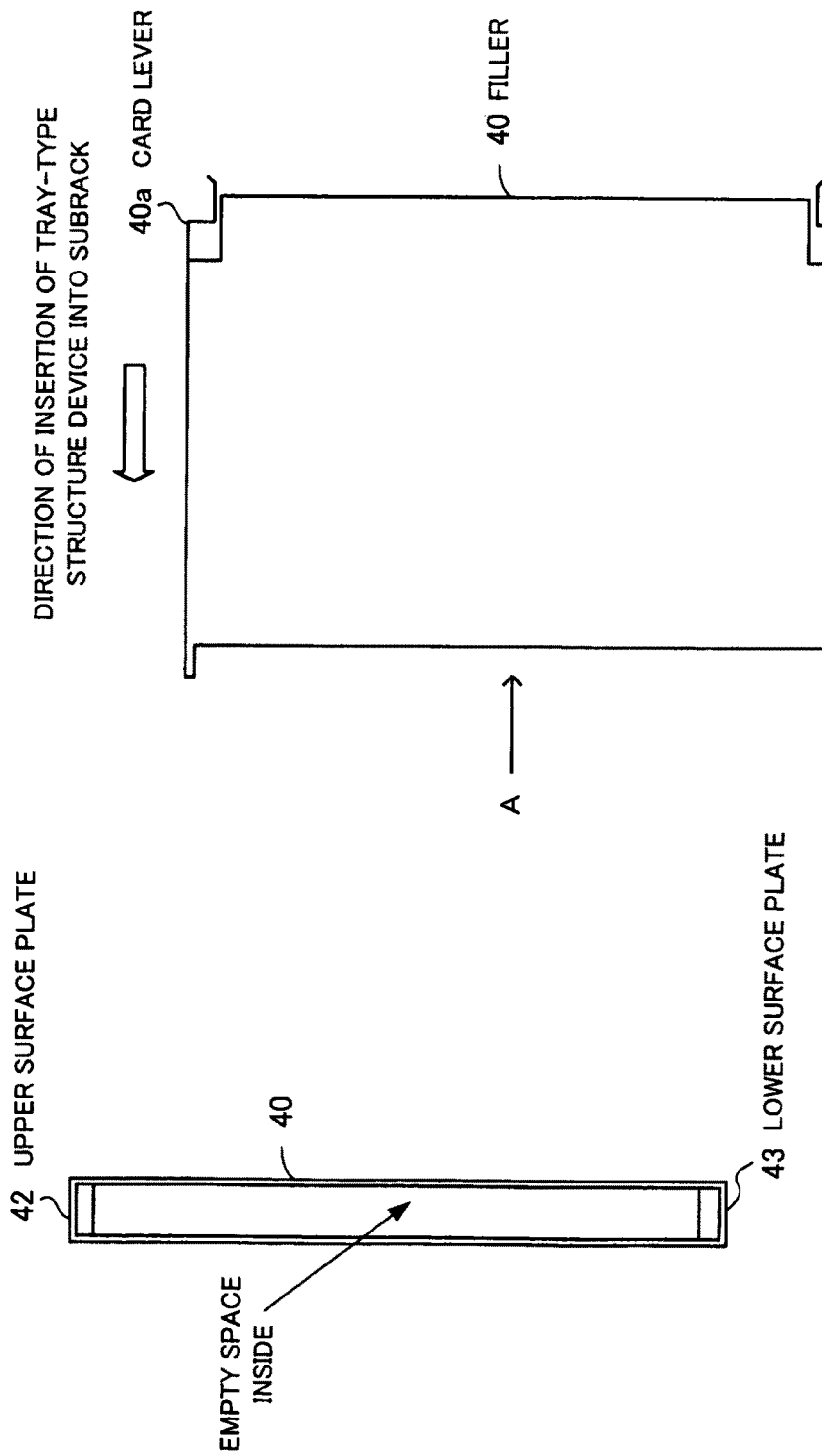
FIGS. 20A and 20B are schematic diagrams of a conventional filler.
Figure 21:
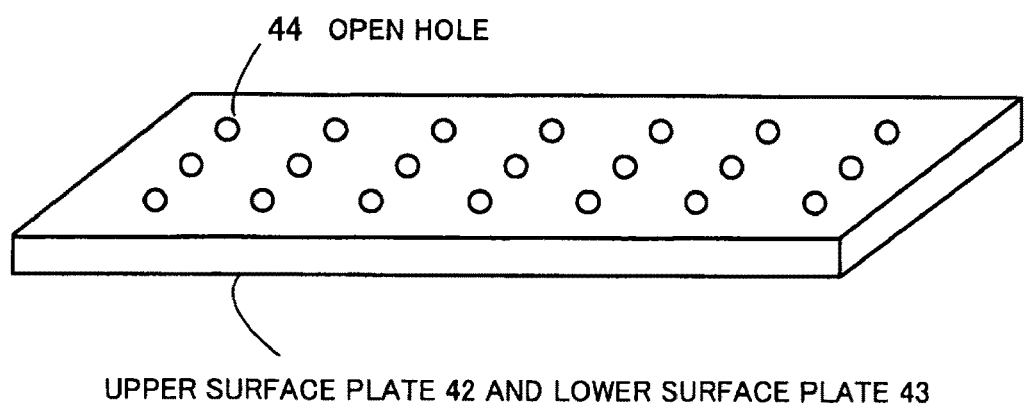
FIG. 21 is a diagram of openings of the filler.

In such a case, it is not necessarily required to dispose the back plate 15 having the opening and closing functions, and hence a tray-type structure device configured not to have the back plate 15 may be provided as in the following variation:

FIG. 17 is a diagram of a tray-type structure device according to the variation. The tray-type structure device 1a is formed by removing the back plate 15 and component parts required for opening and closing the back plate 15 from the FIG. 1 tray-type structure device. In place of the back plate 15, an L-shaped protrusion 16, as illustrated in FIG. 17, is disposed on a rearward end of the side plate 14, and a conductive elastic member 17 is disposed on an outer surface of the L-shaped protrusion 16 such that conductive elastic member 17 is brought into contact with the GND pattern of the backboard. The other construction is the same as that of the FIG. 1 tray-type structure device, and detailed description thereof is omitted.

The tray-type structure device according to the present invention is configured to have a tray structure which includes a front plate having opening and closing functions and is located on a front side of a housing, a top plate formed with a plurality of openings and provided with a function of variably setting a ventilation resistance, a bottom plate formed with a plurality of openings and provided with a function of variably setting a ventilation resistance, and a back plate having opening and closing functions and located on a backboard side of the housing, and has a tray-like shape formed by the front plate, the top plate, the bottom plate, a side plate and the back plate. Thus, the tray-type structure device according to the present invention is configured to be capable of flexibly changing the ventilation resistance, and therefore it is possible to enhance the cooling efficiency, and at the same time enhance customer convenience since it is not necessary to discard the tray-type structure device when a plug-in unit is mounted.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiment(s) of the present invention has(have) been described in detail, it should be understood that various changes, substitutions and alterations could be made hereto without departing from the spirit and scope of the invention.

What is claimed is:

1. A tray-type structure device that is inserted into a slot of a housing in which a plug-in unit is accommodated, comprising:
    a side plate;
    a front plate at a forward end of said side plate, said front plate being positioned on a front side of the housing, and having opening and closing functions;
    a top plate at an upper end of said side plate, said top plate having a plurality of openings formed therethrough and having a function of variably setting a ventilation resistance;
    a bottom plate at a lower end of said side plate, said bottom plate having a plurality of openings formed therethrough and having a function of variably setting a ventilation resistance; and
    a back plate at a rearward end of said side plate, said back plate being positioned on a side of the housing toward a backboard and having opening and closing functions,
    the tray-type structure device having a tray structure having a tray-like shape formed by said front plate, said top plate, said bottom plate, said side plate and said back plate.

2. The tray-type structure device according to claim 1, wherein when the tray-type structure device is accommodated without the plug-in unit mounted in a tray area of the tray structure, the tray-type structure device provides a ventilation resistance against forced air draft from a cooling fan that is disposed at an upper portion or a lower portion of the housing, so as to send air to a plug-in unit accommodated in another slot of the housing, and
    wherein when the plug-in unit is to be accommodated in an empty slot, the plug-in unit is mounted in the tray area, and the tray-type structure device is accommodated in the empty slot in a state having the plug-in unit integrated thereon.

3. The tray-type structure device according to claim 2, wherein said top plate comprises:
    a first top plate that has a plurality of first openings formed therethrough and is fixed at a location for defining the tray area; and
    a second top plate that has a plurality of second openings formed therethrough, the second openings having an aperture ratio, an aperture shape, or aperture positions different from an aperture ratio, an aperture shape or aperture positions of said first openings, and is disposed inward of said first top plate,
    wherein said second top plate has functions of opening and closing about a peripheral portion of the upper end of said side plate, and
    wherein an amount of air flowing into the plug-in unit is adjusted by closing said second top plate such that said second top plate lies on said first top plate to increase the ventilation resistance, or by opening said second top plate to reduce the ventilation resistance.

4. The tray-type structure device according to claim 3, wherein a protrusion having a protruding shape slightly larger than the shape of the second openings of said second top plate is provided on an inner surface of an upper portion of said side plate, and when said second top plate is tilted toward said side plate, said protrusion is press-fitted into one of said second openings of said second top plate, whereby an open state of said second top plate is held.

5. The tray-type structure device according to claim 3, wherein a first card lever is attached to said first top plate, and when the tray-type structure device is accommodated in the slot, said first card lever is pushed in toward the housing to fit a protrusion of said first card lever in a front face of the housing, whereby said front plate is fixed in a closed state, and at the same time said protrusion of said first card lever extends through a hole of one of said first openings of said first top plate and a hole of one of said second openings of said second top plate, to be fitted therein, whereby a state in which said second top plate is closed and lies on said first top plate is held.

6. The tray-type structure device according to claim 2, wherein said bottom plate comprises:
a first bottom plate that has a plurality of first openings formed therethrough and is fixed at a location for defining the tray area; and
a second bottom plate having a plurality of second openings formed therethrough, said second openings having an aperture ratio, an aperture shape, or aperture positions different from an aperture ratio, an aperture shape, or aperture positions of said first openings, and is disposed inward of said first bottom plate,
wherein said second bottom plate has functions of opening and closing about a peripheral portion of the lower end of said side plate, and
wherein an amount of air flowing into the plug-in unit is adjusted by closing said second bottom plate such that said second bottom plate, lies on said first bottom plate to increase the ventilation resistance, or by opening said second bottom plate to reduce the ventilation resistance.

7. The tray-type structure device according to claim 6, wherein a protrusion having a protruding shape slightly larger than the shape of the second openings of said second bottom plate is provided on an inner surface of a lower portion of said side plate, and when said second bottom plate is tilted toward said side plate, said protrusion is press-fitted into one of said second openings of said second bottom plate, whereby an open state of said second bottom plate is held.

8. The tray-type structure device according to claim 6, wherein said bottom plate has a protrusion provided at a location for being fitted in an open hole provided in the plug-in unit, said protrusion being capable of having at least one of a shape, a position, and a number thereof changed in association with the open hole, so as to prevent erroneous insertion of the plug-in unit into the tray area when the plug-in unit is mounted in the tray area.

9. The tray-type structure device according to claim 6, wherein a second card lever is attached to said first bottom plate, and when the tray-type structure device is accommodated in the slot, said second card lever is pushed in toward the housing to fit a protrusion of said second card lever in a front face of the housing, whereby said front plate is fixed in a closed state, and at the same time said protrusion of said second card lever extends through a hole of one of said first openings of said first bottom plate and a hole of one of said second openings of said second bottom plate, to be fitted therein, whereby a state in which said second bottom plate is closed and lies on said first bottom plate is held.

10. The tray-type structure device according to claim 2, wherein when the plug-in unit is not mounted in the tray area, said front plate is in a closed state while being held in a position for defining the tray area, and at the same time said back plate is in a closed state while being held in a position for defining the tray area, and
wherein when the plug-in unit is mounted in the tray area, said front plate is tilted toward an inside of said side plate such that said front plate is in an open state, and at the same time said back plate is tilted toward an outside of said side plate such that said back plate is in an open state.

11. The tray-type structure device according to claim 1, wherein said back plate is L-shaped and has a conductive elastic member formed on an L-shaped bottom thereof, and when said back plate is in a closed state, an L-shaped portion of said back plate serves as a lid for a connector provided on the side of the housing toward the backboard, for protecting the connector from dust, whereas when said back plate is in an open state, said conductive elastic member is brought into contact with a GND pattern on the backboard, to thereby form a shield.

12. The tray-type structure device according to claim 11, wherein a conductive elastic member is provided on an outer surface of said side plate, for being brought into contact with a tray-type structure device accommodated in an adjacent slot, whereby the shield is formed in a connected manner.

* * * * *